United States Patent [19]

Kondo et al.

[11] 4,367,280

[45] Jan. 4, 1983

[54] PHOTOPOLYMERIZABLE COMPOSITION

[75] Inventors: Syunichi Kondo; Akihiro Matsufuji; Akira Umehara, all of Asaka, Japan

[73] Assignee: Fuji Photo Film Co., Ltd., Kanagawa, Japan

[21] Appl. No.: 242,731

[22] Filed: Mar. 11, 1981

Related U.S. Application Data

[63] Continuation of Ser. No. 109,026, Jan. 2, 1980, abandoned, which is a continuation of Ser. No. 870,692, Jan. 19, 1978, abandoned.

[30] Foreign Application Priority Data

Jan. 20, 1977 [JP] Japan ................................... 52-5519

[51] Int. Cl.$^3$ .............................................. G03C 1/68
[52] U.S. Cl. ................................... 430/281; 430/285; 430/287; 430/288; 430/286; 430/919; 430/923; 204/159.15; 204/159.16; 204/159.23
[58] Field of Search ............... 430/281, 282, 283, 284, 430/285, 919, 923, 286, 287, 288; 204/159.16, 159.15, 159.23

[56] References Cited

U.S. PATENT DOCUMENTS

| | | | |
|---|---|---|---|
| Re. 28,789 | 4/1976 | Chang | 430/271 |
| 3,933,682 | 1/1976 | Bean | 252/431 |
| 4,043,887 | 8/1977 | Pacifici et al. | 204/159.23 |
| 4,048,034 | 9/1977 | Martan | 204/159.23 |
| 4,058,398 | 11/1977 | Osada et al. | 430/256 |
| 4,067,791 | 1/1978 | Konno et al. | 204/159.15 |
| 4,072,694 | 2/1978 | Baattesani | 96/115 |
| 4,080,275 | 3/1978 | Photis | 204/159.23 |
| 4,113,592 | 9/1978 | Rybny et al. | 204/159.16 |
| 4,113,593 | 9/1978 | Brazynski et al. | 204/159.15 |
| 4,175,971 | 11/1979 | Shinozaki et al. | 430/919 |

*Primary Examiner*—Jack P. Brammer
*Attorney, Agent, or Firm*—Sughrue, Mion, Zinn, Macpeak and Seas

[57] ABSTRACT

A photopolymerizable composition comprising, as essential components,
(1) a polymerizable compound having at least one ethylenically unsaturated double bond and
(2) a photopolymerization initiator, the photopolymerization initiator being a combination of (a) an aromatic carbonyl compound and (b) a p-dialkylamino aromatic carbonyl compound.

24 Claims, No Drawings

PHOTOPOLYMERIZABLE COMPOSITION

This is a continuation of application Ser. No. 109,026, filed Jan. 2, 1980, now abandoned, which is in turn a continuation of Ser. No. 870,692, filed Jan. 19, 1978, now abandoned.

BACKGROUND OF THE INVENTION

1. Field of the Invention

The present invention relates to photopolymerizable compositions, and more particularly to photopolymerizable compositions containing photopolymerization initiators.

2. Description of the Prior Art

It is known that upon irradiation of compositions such as printing inks, adhesives, etc., in which unsaturated compounds capable of being hardened upon irradiation with electromagnetic radiation are employed as components thereof, with electromagnetic waves such as visible light, ultraviolet light, X-rays, etc., or radiation such as electron beams, neutron beams, α-rays, etc. that the above-mentioned compounds in the compositions are polymerized and thereby hardened. Further, it is known that the polymerization rate increases remarkably if such irradiation is performed in the presence of photopolymerization initiator compositions. Such techniques are described in, for example, U.S. Pat. Nos. 3,551,235, 3,551,246, 3,551,246, 3,551,311 and 3,558,387, Belgian Patent 808,179, Japanese Patent Application (OPI) No. 110781/75 (corresponding to British Pat. No. 1,467,645). These compositions obtained using such techniques are characterized as possessing excellent properties such as bending property, resistance to chemicals, anti-abrasion, luster, adhesive property, color hue, etc. However, on the other hand, these compositions have the disadvantages that since the sensitivity of the compositions to hardening is poor and a long period of time is required for imagewise exposure upon formation of images, images of good quality are not produced in the case of elaborate images if there is a slight vibration in operation; and since the amount of energy emitted from a light source or a radiation source for exposure should be increased, release of a vast amount of heat accompanied thereby must be taken into consideration and further deformation as well as change in the quality of films of the composition tend to occur due to the heat, and the like.

After much investigation to eliminate the above mentioned disadvantages by increasing the sensitivity of photopolymerizable compositions, it has now been found that a photopolymerization initiator having a specific composition markedly increases the photopolymerization rate of a photopolymerizable compound having an ethylenically unsaturated double bond therein, and the present invention has been accomplished.

SUMMARY OF THE INVENTION

An object of the present invention is to provide a highly sensitive photopolymerization initiator as well as a photopolymerization initiator system which are suitable for use with a photopolymerizable composition (one type of the so-called light sensitive resins or photoresists).

Another object of the present invention is to provide a photopolymerization initiator as well as a photopolymerization initiator system which increase the photopolymerization rate of a photopolymerizable composition containing photopolymerizable compounds generally containing an ethylenically unsaturated double bond.

Further objects of the present invention will be apparent from the description hereinbelow.

The present invention provides a photopolymerizable composition comprising, as essential components, (1) a polymerizable compound having at least one ethylenically unsaturated double bond in the molecule thereof (hereinafter often simply referred to as an "ethylenic compound" and with this term "ethylenic compound" referring generally to monomers and oligomers including dimers, trimers, etc.), and (2) a photopolymerization initiator with the photopolymerization initiator being a combination of:

(a) at least one compound selected from the group consisting of a compound having at least one oxo-oxygen atom bonded to an aromatic ring and a compound having at least one oxo oxygen atom bonded to a carbon atom bonded to an aromatic ring (hereafter referred to as an "aromatic carbonyl compound"), and (b) at least one compound selected from the group consisting of the compounds represented by the general formulae (I) through (V) indicated below (hereafter referred to as a "p-dialkylamino aromatic carbonyl compound"):

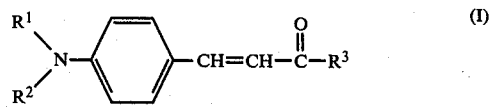

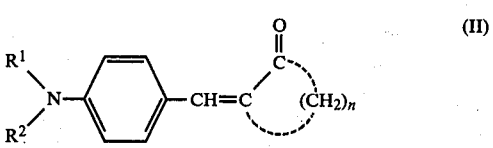

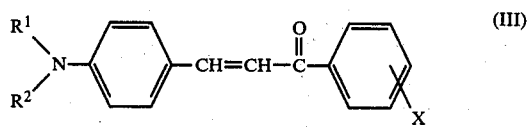

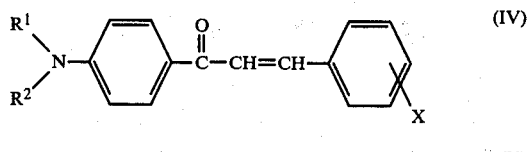

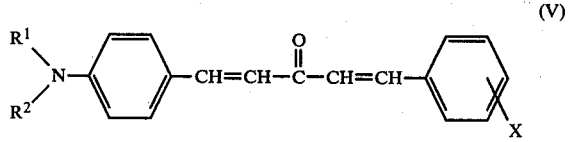

wherein $R^1$ and $R^2$, which may be the same or different, each represents an alkyl group or a substituted alkyl group; $R^3$ represents an alkyl group, a substituted alkyl group, an aryl group, a substituted aryl group, an aralkyl group, a substituted aralkyl group, an alkoxy group, an aryloxy group, or a 5-or 6-membered heterocyclic aromatic monovalent group containing one or more of a nitrogen atom, a sulfur atom and an oxygen atom as heteroatoms; n represents a positive integer of from 3 to 8; and X represents a substituent having a Hammett σ (sigma) constant of from −0.9 to ±0.7.

DETAILED DESCRIPTION OF THE INVENTION

The present invention will be described hereinbelow in detail.

In the present application, the definition of the Hammett σ constant is described in J. E. Leffler, and E. Graunwald, *Rates and Equilibria of Organic Reactions* [John Wiley and Sons, Inc., New York, (1963)] translated by Yuho Tsuno, *Yuki Hanno Sokudo Ron*, published by Hirokawa Shoten, Tokyo (1968).

Further, in the embodiments of the present invention, the photopolymerizable composition can be broadly classified into a photopolymerizable composition containing as component (b) at least one compound selected from the group consiting of the compounds represented by the general formulae (I) and (II) described above, or at least one compound selected from the group consisting of the compounds represented by the general formulae (III), (IV) and (V), of the combination of the photopolymerization initiators.

Compounds having one or more addition polymerizable ethylenically unsaturated double bonds, i.e., ethylenically unsaturated compounds as component (1) employed in the photopolymerizable composition of this invention include monomers (including esters of an oligoester and an unsaturated carboxylic acid), as well as prepolymers such as dimers or trimers and oligomers thereof with other compounds and further include mixtures or copolymers thereof. Specific examples include monomers such as acrylic acid, methacrylic acid, itaconic acid, crotonic acid, isocrotonic acid, maleic acid, esters of aliphatic polyhydric alcohols, e.g., di- or poly-acrylic esters, di- or poly-methacrylic esters or di- or poly-itaconic esters with aliphatic polyhydric alcohols (e.g., having 2 to 20, preferably 2 to 10, carbon atoms and containing 2 to 8, preferably 2 to 6, hydroxy groups) such as ethylene glycol, triethylene glycol, tetraethylene glycol, tetramethylene glycol, neopentyl glycol, 1,10-decanediol, trimethylolethane, trimethylolpropane, 1,2-butanediol, 1,3-butanediol, propylene glycol, pentaerythritol, dipentaerythritol, tripentaerythritol, other poly-(e.g., tetra- to deca-) pentaerythritols, sorbitol, di-mannitol, diols of ethylenically unsaturated aliphatic acids (e.g., undecylenic acid, oleic acid, etc.) and chemically modified substances (e.g., wherein some of the double bonds in the molecule are cleaved or a hydroxyl group thereof is acetylated) thereof, etc. A suitable range of the number of carbon atoms in the esters of the ethylenically unsaturated double bond-containing organic acids for use in this invention is 3 to about 20, preferably 3 to 6, carbon atoms.

Typical specific examples of suitable ethylenically unsaturated compounds as component (1) include: trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol dimethacrylate, 1,3-butanediol diacrylate, 1,3-butanediol dimethacrylate, 1,4-butanediol diitaconate, sorbitol triacrylate, sorbitol tetraacrylate, sorbitol tetramethacrylate, sorbitol pentaacrylate, sorbitol hexaacrylate, 1,4-butylene modified diacrylate, trimethylolpropane modified triacrylate, pentaerythritol modified triacrylate and mixtures thereof, etc.

Addition polymerizable oligoester acrylates and oligoester methacrylates can also be used.

Suitable addition polymerizable oligoester acrylates and oligoester methacrylates (hereinafter "oligoester (meth)acrylates") which can be used herein are reaction products prepared by the esterification of acrylic acid and/or methacrylic acid, one or more polybasic acids and one or more polyhydric alcohols, and can be represented by the general formula (VI):

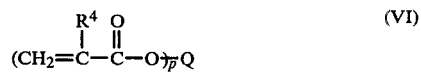

wherein $R^4$ represents a hydrogen atom or a methyl group, Q represents an ester group containing at least one ester bond which comprises one or more polyhydric alcohols and one or more polybasic acids, and p represents an integer of 1 to 6. Preferred reaction products as above-described have a molecular weight of from 246 to about 3,000, more preferably from 284 to about 2,000.

Examples of polyhydric alcohols comprising part of the ester group Q include polyhydric alcohols such as ethylene glycol, 1,2-propylene glycol, 1,4-butanediol, 1,6-hexanediol, trimethylolpropane, trimethylolethane, 1,2,6-hexanetriol, glycerin, pentaerythritol and sorbitol, and polyether type polyhydric alcohols such as diethylene glycol, triethylene glycol, tetraethylene glycol, polyethylene glycol, dipropylene glycol, tripropylene glycol and polypropylene glycol. Preferred polyethylene glycols have a molecular weight of from 60 to about 600, more preferably from 60 to about 400, and preferred polypropylene glycols have a molecular weight of from 76 to about 700, more preferably from 76 to about 500. Preferred polyhydric alcohols are aliphatic polyhydroxy compounds which contain from 2 to 30 carbon atoms, more preferably from 2 to 20 carbon atoms, and have from 2 to 6 -OH groups, more preferably from 2 to 4 -OH groups. Good results are obtained utilizing such aliphatic polyhydroxy compounds having a molecular weight of from 60 to about 700, more preferably from 60 to about 500.

On the other hand, examples of suitable polybasic acids comprising a part of the ester group Q include aromatic polybasic acids such as phthalic acid, isophthalic acid, terephthalic acid, tetrachlorophthalic acid, tetrabromophthalic acid, trimellitic acid, pyromellitic acid, benzophenone dicarboxylic acid, resorcinol diacetic acid and bisphenol A diacetic acid, unsaturated aliphatic polybasic acids such as maleic acid, fumaric acid, citraconic acid, mesaconic acid, itaconic acid, and 5-norbornene-2,3-dicarboxylic acid, and saturated aliphatic polybasic acids such as malonic acid, succinic acid, glutaric acid, adipic acid, pimelic acid, sebacic acid, dodecanoic acid, tetrahydrophthalic acid and norbornene-2,3-dicarboxylic acid. Preferred polybasic acids have from 3 to 30 carbon atoms, more preferably from 4 to 20 carbon atoms (including the carboxylic carbon atom) and contain from 2 to 6—COOH groups, more preferably from 2 to 4 —COOH groups. Such polybasic acids have a molecular weight of from 104 to about 600, with excellent results being obtained using polybasic acids having a molecular weight of from 116 to about 500.

For those polybasic acids which comprise an aromatic ring, such a ring may be substituted and, in such instance, the substituent is most preferably an alkyl group having 1 to 5 carbon atoms, a halogen (Cl, Br, I) atom or a haloalkyl group comprising an alkyl moiety having 1 to 5 carbon atoms and CL, Br or I.

As indicated, the ester group Q includes those composed of one polyhydric alcohol and two or more polybasic acids and those composed of two or more polyhydric alcohols and one or more polybasic acids. Further, the ester group Q includes those containing one molecule of polyhydric alcohol and one molecule of polybasic acid and those containing two or more molecules of one or both of the polyhydric alcohol and the polybasic acid. In short, any ester group Q can be used if at least one ester bond is present.

Further, the ester group Q includes those having a hydroxyl group, those having a hydroxyl group esterified with a monobasic carboxylic acid, preferably an aliphatic acid having 1 to 10 carbon atoms, most preferably 1 to 5 carbon atoms (excluding the carboxylic carbon) or an aryl carboxylic acid comprising 1 or 2 aromatic rings, preferably 1 ring, and having 6 to 15 carbon atoms, more preferably 6 to 10 carbon atoms (excluding the carboxylic carbon), and those having a hydroxyl group substituted with an alkoxy group, preferably an alkoxy group with from 1 to 5 carbon atoms, such as a methoxy group or an ethoxy group. Further, Q may contain a carboxyl group, i.e., a free carboxyl group(s) which is not esterified. For instance, an example of such a Q group containing a carboxyl group is:

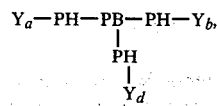

free carboxyl wherein PB represents a polybasic acid and PH represents a polyhydric alcohol.

The number p in the formula (VI) and the number of the ester bonds included in Q can be controlled by changing the kind and molar ratio of acrylic acid or methacrylic acid, polyhydric alcohol and polybasic acid in the production of the oligoester (meth)acrylate. It is generally preferred for the value of p to be 1 to 6 to prevent gelation during synthesis. When the value of p is 2 or more, an oligoester (meth)acrylate wherein either only an acryloyl group or only a methacryloyl group is included in the same molecule may be used or an oligoester (meth)acrylate wherein both an acryloyl group and a methacryloyl group are included at a desired ratio in the same molecule may be used.

For example, the ester group can take various forms, some of which include, for instance: $Y_a$—PH—PB—PH—$Y_b$, $Y_a$(PH—PB)$_c$PH—$Y_b$,

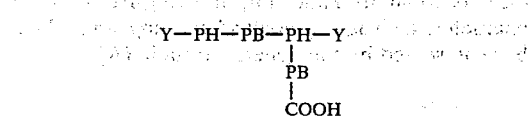

and the like, wherein Y is

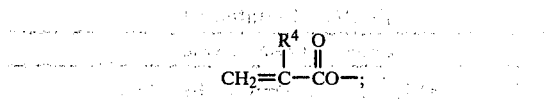

a is an integer of 1 to 5; b is an integer of 1 to 5; c is an integer of 2 to 5; d is an integer of 1 to 5; a+b is 2 to 6; and a+b+d is 3 to 6.

The oligoester (meth)acrylate can be easily synthesized in a yield of 80% or more by heating a solution containing acrylic acid or methacrylic acid, a polyhydric alcohol and a polybasic acid in the ratio desired in the final product at 60° to 100° C. in the presence of a thermal polymerization inhibitor such as hydroquinone, p-methoxyphenol or phenothiazine (0.1 to 0.01% by weight based on the sum total of acrylic acid and methacrylic acid) and a dehydration catalyst such as sulfuric acid or zinc chloride (0.1 to 0.01% by weight based on the sum total of acrylic acid and methacrylic acid) [see Japanese Patent Application (OPI) 133491/74, abstracted in *Chemical Abstracts*, 82, 172726a (1975)].

Examples of oligoester (meth)acrylates which can be used in the present invention are shown in Table 1 below. However, other various kinds of oligoester (meth)acrylates, [for example, those described in U.S. Pat. No. 3,732,107 and in Japanese Patent Application (OPI) No. 133491/74, abstracted in *Chemical Abstracts*, 82, 172726a (1975)] can be suitably used in the present invention. In Table 1, Y in the formula represents either an acryloyl group (CH₂=CH—CO—) or a methacryloyl group

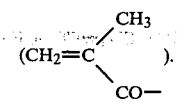

TABLE 1

| Oligoester (Meth)Acrylate |
|---|
| Y—OCH₂CH₂OOC—CH=CH—COOCH₂CH₂OH |
| Y—OCH₂CH(CH₃)—OOC—CH₂CH₂—COO—CH(CH₃)CH₂OH |
| Y—O(CH₂CH₂O)₂OC—C₆H₄—CO(OCH₂CH₂)₂OH |
| Y(OCH₂)₄OOC(CH₂)₄CO₂O(CH₂)₄OOC—CH₃ |
| Y—OCH₂CH₂OOC—C₆H₄—COOCH₂CH₂O—Y |
| Y(OCH₂CH₂OOC—C₆H₄—CO)₂OCH₂CH₂O—Y |
| Y—O(CH₂CH₂O)₃OC—CH=CH—CO(OCH₂CH₂)₃O—Y |
| Y—OCH₂CH₂OOC⟨bicyclic⟩COOCH₂CH₂O—Y |
| Y(OCH₂CH₂)₃OOC(CH₂)₄CO₂O(CH₂CH₂O)₃Y |
| Y(OCH₂CH₂)₂OOC—C₆H₄—CO₃O(CH₂CH₂O)₂Y |
| Y(OCH₂CH₂)₁₀OOC—CH₂—COO(CH₂CH₂O)₁₀Y |
| Y(OCH₂CH₂)₁₀OOC⟨aryl⟩COO(CH₂CH₂O)₁₀Y, —CO— |

TABLE 1-continued
Oligoester (Meth)Acrylate

Y—OCH₂CH₂OOC—C₆H₄—COOCH₂  
Y—OCH₂CH₂—OOC—C₆H₄—COOCH₂—C—C₂H₅  
Y—OCH₂CH₂—OOC—CH=CH—COOCH₂

Y—OCH₂  
　　　＼  
　　　　CH—OOC—C₆H₄—COO—CH₂CH₂—OOC—C₆H₄—  
　　　／  
Y—OCH₂

CH₂O—Y  
　　　　　　　　　　　　　　　　　　　　／  
　　　　　　　　　　　　　　—COO—CH  
　　　　　　　　　　　　　　　　　　　　＼  
　　　　　　　　　　　　　　　　　　　　　CH₂O—Y

Y—OCH₂  
　　　＼  
Y—OCH₂—C—CH₂OOC—CH=CH—COO—(CH₂CH₂O)ₓ̄OC—  
　　　／  
Y—OCH₂

CH₂O—Y  
　　　　　　　　　　　　　　　　　　　　／  
　　　　　—CH=CH—COOCH₂—C—CH₂O—Y  
　　　　　　　　　　　　　　　　　　　　＼  
　　　　　　　　　　　　　　　　　　　　　CH₂O—Y

The photopolymerization initiator which gives rise to remarkable characteristics in the photopolymerizable composition in accordance with the present invention is explained below:

(a) Typical aromatic carbonyl compounds which can be used are aromatic acyloins, aromatic acyloin ethers, aromatic ketones and polycyclic condensed quinones.

In general, these aromatic carbonyl compounds can be classified into two basic types, i.e., (I) compounds where at least one oxo oxygen atom (=O) is bonded directly to an aromatic ring or a ring having aromatic character, such as a cycloalkadiene ring, and which can be represented by the general formula (A)

$$Ar=O \qquad (A)$$

wherein Ar represents an aromatic moiety; such as fused polycyclic quinones (including dicyclic quinones having a naphthoquinone type structure) of the general formula (A-1) below

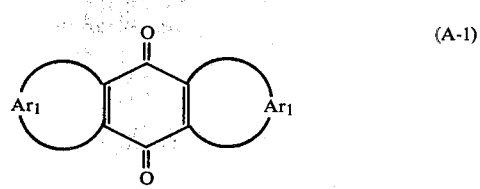

(A-1)

wherein $Ar_1$ represents the atoms necessary to form an aromatic ring, such as a benzene ring, or cyclic ketones of the general formula (A-2)

(A-2)

wherein $Ar_2$ represents the atoms necessary to complete a ring with aromatic character, such as a cycloalkadiene ring; and (II) compounds where at least one oxo oxygen atom (=O) is bonded to a carbon atom bonded to an aromatic ring which can be represented by the general formula (B)

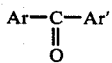

$$Ar-C-Ar' \quad (B)$$
$$\parallel$$
$$O$$

wherein Ar' is Ar,

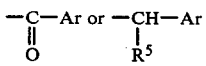

$$-C-Ar \text{ or } -CH-Ar$$
$$\parallel \qquad \quad |$$
$$O \qquad \quad R^5$$

and Ar is as described above, such as benzophenones of the general formula (B-1)

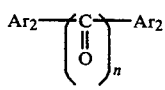

where $Ar_2$ is an aromatic moiety and n is 1; benzyls of the general formula (B-1) above where $Ar_2$ is as described above and n is 2; acyloins of the general formula (B-2) below

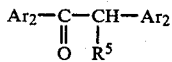

$$Ar_2-C-CH-Ar_2 \quad (B-2)$$
$$\parallel \quad |$$
$$O \quad R^5$$

where $Ar_2$ is as described above and $R^5$ is a hydroxy group; and acyloin ethers of the general formula (B-2) above where $Ar_2$ is as described above and $R^5$ is a straight or branched chain alkoxy group having 1 to 5 carbon atoms.

Specific examples of aromatic acyloins include benzoin, o-toluoin, p-toluoin, furoin, etc. Specific examples of aromatic acyloin ethers include benzoin methyl ether, benzoin ethyl ether, benzoin isopropyl ehter, benzoin sec-butyl ether, o-toluoin methyl ether, p-toluoin methyl ether, etc. Specific examples of aromatic ketones include benzophenone, phenyl tolyl ketone, 2-chlorobenzophenone, 2-chloroacetophenone, acetophenone, propiophenone, benzil, 2,2′-dimethylbenzil, Michler's ketone, bis(p-aminophenyl) ketone, phenyl β-naphthyl ketone, fluorenone, anthrone, benzanthrone, 10,10′-bianthrone, etc. Specific examples of polycyclic condensed quinones include anthraquinone, 1-hydroxyanthraquinone, 1-methylanthraquinone, 2-methylanthraquinone, 2-ethylanthraquinone, 1-chloroanthraquinone, 1-bromoanthraquinone, 2-chloroanthraquinone, phenanthraquinone, 1-methylphenanthraquinone, 4-ethylphenanthraquinone, 2-chlorophenanthraquinone, 3-bromophenanthraquinone, 2,7-dimethylphenanthraquinone, 2,7-di-tert-butylphenanthraquinone, 1,2-benzanthraquinone, etc.

Of these aromatic type carbonyl compounds, benzanthrone, 1,2-benzanthraquinone and fluorenone are preferred from the standpoints of increased sensitivity, ready availability, compatibility with photopolymerizable compositions, stability with the passage of time, strength of the images formed, and the like. Benzanthrone and 1,2-benznanthraquinone are particularly preferred.

Component (b) of the photopolymerization initiator which is represented by the general formulae (I) through (V) described above is explained below.

The substituents, $R^1$ and $R^2$, on the p-dialkylamino aromatic carbonyl compounds represented by the general formulae (I) through (V), which may be the same or different, each represent an alkyl group or a substituted alkyl group. Suitable alkyl groups include straight and branched chain alkyl groups having 1 to 18 carbon atoms, as well as a cyclic alkyl groups having 5 to 18 carbon atoms. Specific examples of suitable alkyl groups include a methyl group, an ethyl group, a propyl group, a butyl group, a pentyl group, a heptyl group, an octyl group, a nonyl group, a decyl group, a dodecyl group, an octadecyl group, an isopropyl group, an isobutyl group, an isopentyl group, an isohexyl group, a sec-butyl group, a neopentyl group, a tert-butyl group, a tert-pentyl group, a cyclopentyl group, a cyclohexyl group, a cycloheptyl group, a 2-norbornyl group, an α-decalyl group, a β-decalyl group, etc. Of these groups, the straight and branched chain alkyl groups having 1 to 10 carbon atoms as well as cyclic alkyl groups having 6 to 10 carbon atoms are preferred.

Suitable substituents which can be present on the substituted alkyl group include one or more of a halogen atom (e.g., a fluorine atom, a chlorine atom, a bromine atom and an iodine atom) and a hydroxyl group; and as the alkyl moiety, suitable examples include the straight chain, branched chain and cyclic alkyl groups having 1 to 18 carbon atoms, more preferably having 1 to 10 carbon atoms, described above for $R^1$ and $R^2$. Specific examples of these groups include a chloromethyl group, a bromomethyl group, a 2-chloroethyl group, 2,2,2-trichloroethyl group, 2-chloropentyl group, a 1-(chloromethyl)propyl group, a 10-bromodecyl group, an 18-methyl-octadecyl group, a chlorocyclohexyl group, a hydroxymethyl group, a 2-hydroxyethyl group, a 2-hydroxybutyl group, a 5-hydroxypentyl group, a 10-hydroxydecyl group, a 2-hydroxyoctadecyl group, a 2-(hydroxymethyl)ethyl group, a hydroxycyclohexyl group, a 3-hydroxy-2-norbornyl group, etc.

The substituent, $R^3$, of the p-dialkylamino aromatic carbonyl compound represented by the general formula (I) represents an alkyl group, a substituted alkyl group, an alkoxy group, an aryl group, an aralkyl group, an aryloxy group, or a 5-membered or 6-membered heterocyclic aromatic ring monovalent residue containing one or more N, S or O atoms as hetero atoms. The alkyl group and the substituted alkyl group for $R^3$ can be the same as defined for the alkyl group and the substituted alkyl group for $R^1$ and $R^2$ described above. Examples of alkoxy groups for $R^3$ include an alkoxy group containing a straight chain, branched chain and cyclic alkyl moiety having 1 to 10 carbon atoms, preferably having 1 to 5 carbon atoms. Specific examples of alkoxy groups include a methoxy group, an ethoxy group, a propoxy group, a butoxy group, a pentyloxy group, a hexyloxy group, a nonyloxy group, a decyloxy group, an isopropoxy group, a sec-butoxy group, a tert-butoxy group, an isopentyloxy group, a cyclohexyloxy group, a 2-norbornyloxy group, etc.

Typical examples of aryl groups for $R^3$ include a residue of one benzene ring, a residue of two- and three-condensed benzene rings, a residue of a condensed system of a benzene ring and 5-membered unsaturated ring, and a residue formed by substituting on the ring forming carbon atoms of these residues one or more substituents, which may be the same or different, such as a halogen atom (a fluorine atom, a chlorine atom, a bromine atom, and a fluorine atom), a nitro group, an amino group, a substituted amino group, (a monoalkylamino group in which examples of the alkyl moiety are a methyl group, an ethyl group, a propyl group, a pentyl group, an isopropyl group, a sec-butyl group, an isopentyl group, etc.), a dialkylamino group (in which examples of the alkyl moieties are the same as those for the monoalkylamino group), and a monoacylamino group (in which examples of the acyl moiety are an acetyl group, a propionyl group, a butyryl group, an isobutyryl group, a valeryl group, etc.), a cyano group, an alkyl group (a straight chain, branched chain or cyclic alkyl group having up to 18 carbon atoms, preferably a straight chain, branched chain or cyclic alkyl group having up to 10 carbon atoms, where specific examples of these groups are as previously described), a haloalkyl group (such as a chloromethyl group, a trifluoromethyl group, etc.), an alkoxy group (in which examples of the alkyl moiety are a methyl group, an ethyl group, a butyl group, a pentyl group, an isopropyl group, an isopentyl group, a 2-methylbutyl group, a sec-butyl group, etc.), an aryloxy group (in which examples of the aryl moiety are a phenyl group, a 1-naphthyl group, a 2-naphthyl group, etc.), an alkoxycarbonyl group (in which examples of the alkyl moiety are a methyl group, an ethyl group, a propyl group, an isopropyl group, a butyl group, etc.), an acyloxy group (in which examples of the acyl moiety are the same as those described above for the monoacylamino group), an alkoxysulfonyl group (in which examples of the alkyl moiety are the same as the examples of the alkyl moiety for the alkoxy group described above), and the like.

Specific examples of these aryl groups include a phenyl group, a chlorophenyl group, a nitrophenyl group, an aminophenol group, a (methylamino)phenyl group, an (ethylamino)phenyl group, a (dimethylamino)phenyl group, an acetylaminophenyl group, a tolyl group, an ethylphenyl group, a (chloromethyl)phenyl group, an acetylphenyl group, a phenoxyphenyl group, a methoxycarbonylphenyl group, an ethoxycarbonylphenyl group, an acetoxyphenyl group, a methoxysulfonylphenyl group, a naphthyl group, a 2-amino-1-naphthyl group, a 1-dimethylamino-2-naphthyl group, a chloronaphthyl group, a methylnaphthyl group, an anthryl group, a phenanthryl group, an indenyl group, a biphenylyl group, a chlorobiphenylyl group, an aminobiphenylyl group, a methylbiphenylyl group, an acenaphthenyl group, etc. Of these groups, residues of one benzene ring and residues of one benzene ring substituted with one or more of the above described substituents, which may be the same or different, are preferred.

Examples of aralkyl groups for $R^3$ include straight chain, branched chain and cyclic alkyl groups having 1 to 10 carbon atoms, preferably 1 to 5 carbon atoms, substituted with a phenyl group or a naphthyl group in which the phenyl group or the naphthyl group may be unsubstituted or substituted with one or more substituents such as an alkyl group. Specific examples of suitable aralkyl groups include a benzyl group, a phenethyl group, a 3-phenylpropyl group, a 3-phenylhexyl group, a 10-phenyldecyl group, a 4-phenylcyclohexyl group, a p-tolylmethyl group, a p-ethylbenzyl group, an o-methylphenethyl group, a p-methylphenethyl group, etc.

Specific examples of aryloxy groups for $R^3$ include a phenoxy group, a naphthyloxy group and a biphenylyloxy group.

Specific examples of the N, S and/or O-containing heterocyclic aromatic ring monovalent residues include a furyl group, a benzofuryl group, a pyrolyl group, a pyridyl group, an indolyl group, a thienyl group and a benzothienyl group.

The substituent X on the p-dialkylamino aromatic carbonyl compounds represented by the general formulae (III) to (V) represents a substituent having a Hammett sigma ($\sigma$) constant in the range of from $-0.9$ to $+0.7$. Specific examples of these substituents include a hydrogen atom, a methyl group, an ethyl group, an isopropyl group, a tert-butyl group, a phenyl group, a trifluoromethyl group, a cyano group, an acetyl group, an ethoxycarbonyl group, a carboxyl group, a carboxylato group ($-COO^\ominus$), an amino group, a methylamino group, a dimethylamino group, an ethylamino group, a diethylamino group, an acetylamino group, a $-PO_3H$ group, a methoxy group, an ethoxy group, a propoxy group, an isopropoxy group, a butoxy group, a pentyloxy group, a phenoxy group, a hydroxyl group, an acetoxy group, a methylthio group, an ethylthio group, an isopropylthio group, a mercapto group, an acetylthio group, a thiocyano group ($-SCN$), a methylsulfinyl group, an ethylsulfinyl group, a methylsulfinyl group, an ethylsulfonyl group, an aminosulfonyl group, a dimethylsulfonyl group $[-S^\oplus(CH_3)_2]$, a sulfonato group ($-SO_3^\ominus$), a fluorine atom, a chlorine atom, a bromine atom, an iodine atom, an iodyl group, a trimethylsilyl group $[-Si(CH_3)_3]$, a triethylsilyl group, a trimethylstannyl group $[-Sn(CH_3)_3]$, etc. Of these groups, a hydrogen atom, a methyl group, an ethyl group, a methoxy group, an ethoxy group, a dimethylamino group, a diethylamino group, a chlorine atom, a bromine atom, a nitro group, and a cyano group are preferred.

In the p-dialkylamino aromatic carbonyl compound represented by the general formula (II), n represents an integer of from 3 to 8, preferably 3 and 4.

The p-dialkylamino aromatic carbonyl compounds represented by the general formula (I) are compounds having a p-dialkylaminocinnamoyl group therein. Specific examples of these compounds include p-dimethylaminostyryl methyl ketone, p-dimethylaminostyryl ethyl ketone, p-dimethylaminostyryl propyl ketone, p-dimethylaminostyryl butyl ketone, p-dimethylaminostyryl isobutyl ketone, p-dimethylaminostyryl tert-butyl ketone, p-dimethylaminostyryl cyclohexyl ketone, p-dimethylaminostyryl benzyl ketone, p-dimethylaminostyryl phenethyl ketone, methyl p-dimethylaminocinnamate ester, ethyl p-dimethylaminocinnamate, p-dimethylaminostyryl 2-pyridyl ketone, p-dimethylaminostyryl 4-pyridyl ketone, p-dimethylaminostyryl 2-thienyl ketone, p-dimethylaminostyryl 9-anthryl ketone, p-diethylaminostyryl methyl ketone, p-diethylaminostyryl ethyl ketone, p-diethylaminostyryl butyl ketone, etc.

The p-dialkylamino aromatic carbonyl compounds represented by the formula (II) are 2-(p-dialkylaminobenzylidene)cycloalkanones. Specific examples of these compounds include 2-(p-dimethylaminobenzylidene)cyclohexanone, 2-(p-dimethylaminobenzylidene)cyclopentanone, 2-(p-diethylaminobenzylidene)cyclohexanone and 2-(p-diethylaminobenzylidene)cyclopentanone.

The p-dialkylamino aromatic carbonyl compounds represented by the general formula (III) are p-dialkylaminochalcones and derivatives thereof. Specific examples of these compounds include p-dimethylaminochalcone (i.e., p-dimethylaminostyryl phenyl ketone), p-dimethylamino-p'-cyanochalcone [i.e., p-dimethylaminostyryl p-cyanophenyl ketone (hereinafter the positions shown without the prime mark designate the positions on the benzene ring on the styryl group side, and the positions shown with the prime mark designate the positions on the benzene ring on the phenyl group side)], p-dimethylamino-p'-chlorochalcone, p-dimethylamino-m'-chlorochalcone, p-dimethylamino-p'-bromochalcone, p-dimethylamino-m'-bromochalcone, p-dimethylamino-p'-methylchalcone, p-dimethylamino-m'-methylchalcone, p-dimethylamino-p'-ethylchalcone, p-dimethylamino-m'-ethylchalcone, p-dimethylamino-p'-methoxychalcone, p-dimethylamino-m'-methoxychalcone, p-dimethylamino-p'-ethoxychalcone, p-dimethylamino-m'-ethoxychalcone, p-dimethylamino-p'-dimethylaminochalcone, p-diethylaminochalcone, p-diethylamino-p'-cyanochalcone, p-diethylamino-m'-chlorochalcone, p-diethylamino-p'-chlorochalcone, p-diethylamino-m'-bromochalcone, p-diethylamino-p'-bromochalcone, p-diethylamino-m'-methylchalcone, p-diethylamino-p'-methylchalcone, p-diethylamino-m'-ethylchalcone, p-diethylamino-p'-methylchalcone, p-diethylamino-p'-ethoxychalcone, p-diethylamino-m'-methoxychalcone, and p-diethylamino-p'-diethylaminochalcone.

The p-dialkylamino aromatic carbonyl compounds represented by the general formula (IV) are chalcone derivatives. Specific examples of these compounds include p'-dimethylaminochalcone (i.e., p-dimethylaminophenylstyryl ketone), p-cyano-p'-dimethylaminochalcone (i.e., p-cyanophenyl p-dimethylaminostyryl ketone) (the symbols indicating the positions with and without prime marks have the same meaning as defined above), p-chloro-p'-dimethylaminochalcone, m-chloro-p'-dimethylaminochalcone, m-bromo-p'-dimethylaminochalcone, p-bromo-p'-dimethylaminochalcone, m-methyl-p'-dimethylaminochalcone, p-methyl-p'-dimethylaminochalcone, m-ethyl-p'-dimethylaminochalcone, p-ethyl-p'-dimethylaminochalcone, m-methoxy-p'-dimethylaminochalcone, p-methoxy-p'-dimethylaminochalcone, m-ethoxy-p'-dimethylaminochalcone, p-ethoxy-p'-dimethylaminochalcone, p,p'-bis(dimethylamino)chalcone, p,p'-bis(diethylamino)chalcone, p'-diethylaminochalcone, p-cyano-p'-diethylaminochalcone, p-chloro-p'-diethylaminochalcone, m-bromo-p'-diethylaminochalcone, p-chloro-p'-diethylaminochalcone, p-ethyl-p'-diethylaminochalcone, m-ethyl-p'-diethylaminochalcone, p-methoxy-p'-diethylaminochalcone and m-ethoxy-p'-diethylaminochalcone.

The dialkylamino aromatic carbonyl compounds represented by the general formula (V) are p-dialkylstyryl ketone derivatives. Specific examples of these compounds include p-dimethylaminostyryl p-cyanostyryl ketone, p-dimethylaminostyryl p-chlorostyryl ketone, p-dimethylaminostyryl m-chlorostyryl ketone, p-dimethylaminostyryl p-bromostyryl ketone, p-dimethylaminostyryl m-bromostyryl ketone, p-dimethylaminostyryl ketone, p-dimethylaminostyryl m-methylstyryl ketone, p-dimethylaminostyryl p-methylstyryl ketone, p-dimethylaminostyryl p-ethylstyryl ketone, p-dimethylaminostyryl m-ethylstyryl ketone, p-dimethylaminostyryl p-methoxystyryl ketone, p-dimethylaminostyryl m-methoxystyryl ketone, p-dimethylaminostyryl p-ethoxystyryl ketone, bis(p-dimethylaminostyryl)ketone, p-diethylaminostyryl p-cyanostyryl ketone, p-diethylaminostyryl p-bromostyryl ketone, p-diethylaminostyryl m-chlorostyryl ketone, p-diethylaminostyryl styryl ketone, p-diethylaminostyryl p-methylstyryl ketone, p-diethylaminostyryl m-ethylstyryl ketone, p-diethylaminostyryl p-methoxystyryl ketone, p-diethylaminostyryl m-ethoxystyryl ketone and bis(p-diethylaminostyryl)ketone.

Of the above described compounds represented by the general formulae (I) to (V), preferred compounds employed in the present invention are as follows.

Preferred compounds represented by the general formula (I) are p-dimethylaminostyryl methyl ketone, p-dimethylaminostyryl ethyl ketone, p-dimethylaminostyryl propyl ketone, p-dimethylaminostyryl butyl ketone, p-dimethylaminostyryl isobutyl ketone, p-dimethylaminostyryl tert-butyl ketone, p-dimethylaminostyryl cyclohexyl ketone, p-dimethylaminostyryl benzyl ketone, p-dimethylaminostyryl phenethyl ketone, methyl p-dimethylamino cinnamate, ethyl p-dimethylaminocinnamate, p-dimethylaminostyryl 2-pyridyl ketone, p-dimethylaminostyryl 4-pyridyl ketone, p-dimethylaminostyryl 2-thienyl ketone, and p-dimethylamino 9-anthryl ketone.

Preferred compounds represented by the general formula (II) are 2-(p-dimethylaminobenzylidene)cyclohexanone and 2-(p-dimethylaminobenzylidene)cyclopentanone.

Preferred compounds represented by the general formula (III) are p-dimethylaminochalcone, p-dimethylamino-m'-chlorochalcone, p-dimethylamino-p'-chlorochalcone, p-dimethylamino-m'-bromochalcone, p-dimethylamino-p'-bromochalcone, p-dimethylamino-p'-cyanochalcone, p-dimethylamino-p'-methoxychalcone, p-dimethylamino-p'-methylchalcone, p-dimethylamino-m'-methylchalcone, p-dimethylamino-p'-ethylchalcone, p-dimethylamino-m'-ethylchalcone, p-diethylamino-p'-bromochalcone, p-diethylamino-m'-bromochalcone, p'-diethylamino-p'-chlorochalcone and p-diethylamino-m'-chlorochalcone.

Preferred compounds represented by the general formula (IV) are p-'-dimethylaminochalcone, p-cyano-p'-dimethylaminochalcone, m-chloro-p'-dimethylaminochalcone, p-chloro-p'-dimethylaminochalcone, m-bromo-p'-dimethylaminochalcone, p-bromo-p'-dimethylaminochalcone, m-methyl-p'-dimethylaminochalcone, p-methyl-p'-dimethylaminochalcone, p-methyl-p'-dimethylaminochalcone, m-ethyl-p'-dimethylaminochalcone, p-ethyl-p'-dimethylaminochalcone, p-methoxy-p'-dimethylaminochalcone and p,p'-bis(dimethylamino)chalcone.

Preferred compounds represented by the general formula (V) are p-dimethylaminostyryl p-methylstyryl ketone, p-dimethylaminostyryl p-ethylstyryl ketone, p-dimethylaminostyryl p-chlorostyryl ketone, p-dimethylaminostyryl m-chlorostyryl ketone, p-dimethylaminostyryl p-bromostyryl ketone, p-dimethylaminostyryl m-bromostyryl ketone, p-dimethylaminostyryl p-methoxystyryl ketone, p-dimethylaminostyryl p-ethoxystyryl ketone, p-dimethylaminostyryl p-cyanostyryl ketone, p-dimethylaminostyryl m-methylstyryl ketone, p-dimethylaminostyryl m-ethylstyryl ketone, bis(p-dimethylaminostyryl)ketone and bis(p-diethylaminostyryl)ketone.

A typical process for synthesizing the p-dialkylamino aromatic carbonyl compounds described above is set forth herebelow. For example, p-dimethylaminostyryl propyl ketone can be synthesized by the condensation (Perkin reaction, or the like) of p-dimethylaminobenzaldehyde and propyl ethyl ketone; and p-dimethylaminochalcone can be synthesized by the condensation reaction (Perkin reaction, or the like) of p-dimethylaminobenzaldehyde and phenyl methyl ketone. Specifically, the compounds represented by the general formulae (I) through (V) can be synthesized in accordance with the method of described in Pfeiffer and O. Angen, *Justus Liebigs Annalen der Chemie*, vol. 44, pages 228 to 265 (1925), the method disclosed in B. N. Dashkevich and I. V. Smolanka, *Ukrain, khim. Zhur.*, vol. 21, pages 619 to 624 (1955), and the method disclosed in I. V. Smedanka, *Nauch. Zapjski, Uzhgrod. Univ.*, vol. 18, pages 15 to 19 (1957), or the like.

The amount of the photopolymerization initiator present in the photopolymerizable composition is accordance with the present invention can vary over a wide range of from about 1:5 to about 1:1000, preferably about 1:10 to about 1:100, as a weight ratio of the photopolymerization initiator (2) to the ethylenic compound (1). The weight ratio of the components (a):(b) of the photopolymerization initiator is in a range of from about 30:1 to about 1:30, preferably about 10:1 to about 1:10.

The photopolymerizable composition of the present invention comprising the above described ethylenic compound (1) and photopolymerization initiator (2) can also contain additives such as conventional binders, thermal polymerization inhibitors, plasticizers, coloring agents, surface smoothening agents, and the like.

For the purposes of forming resist images (having a thick thickness) on light sensitive elements such as light sensitive materials suitable for peeling off development (development by delamination) or light sensitive materials suitable for liquid development, high molecular weight materials capable of forming a film (binders) can be employed in combination therewith. Any materials can be employed as long as they are organic high molecular weight polymers which are compatible with the compounds containing polymerizable ethylenically unsaturated double bonds, but high molecular weight materials which enable peeling off type development or development with water or with a weakly alkaline aqueous solution are preferably chosen. The organic high molecular weight polymers are selectively employed, not only as mere film forming agents in the composition but also as exhibiting affinity thereto depending upon the kind of aqueous solution, weakly alkaline aqueous solution or organic solvent which is used as a developing solution. For instance, if a water soluble organic high molecular weight polymer is employed, development with water is possible. Examples of such organic high molecular weight polymers include addition polymers having carboxyl groups in the side chain thereof, e.g., acrylic acid copolymers, itaconic acid copolymers, partially esterified maleic acid copolymers, maleic acid copolymers, crotonic acid copolymers, etc.; and likewise, acidic cellulose derivatives having carboxyl groups in the side chain thereof. In addition, addition polymers having hydroxyl groups with which cyclic acid anhydrides are esterified, and the like are also useful. Further, polyvinyl pyrrolidone and polyethylene oxides, etc. are useful as water soluble organic high molecular weight substances. Furthermore, in order to enhance the strength of the films hardened after exposure, alcohol soluble nylons and polyethers of 2-bis(4-hydroxyphenyl)propane and epichlorohydrin, and the like are also useful. These organic high molecular weight polymers can be incorporated in an optional amount into the composition, but an amount exceeding about 90 wt% based on the weight of the ethylenic compound results in no advantageous effects from the standpoint of the strength of the images, etc.

Typical examples of linear organic high molecular weight polymers which can be employed in peeling off type development include chlorinated polyolefins such as chlorinated polyethylene, chlorinated polypropylene, etc; polymethyl methacrylate, polyacrylic acid, polymethacrylic acid, polyacrylic acid alkyl esters (in which examples of the alkyl group are a methyl group, an ethyl group, a butyl group, etc.), copolymers of acrylic acid alkyl esters (in which examples of the alkyl group are as described above) and at least one monomer such as acrylonitrile, vinyl chloride, vinylidene chloride, styrene, butadiene, or the like; polyvinyl chlorides, copolymers of vinyl chloride and acrylonitrile, polyvinylidene chloride, copolymers of vinylidene chloride and acrylonitrile, polyvinyl acetate, copolymers of vinyl acetate and vinyl chloride, polyvinyl alcohol, polyvinyl pyrrolidone, polyacrylonitrile, copolymers of acrylonitrile and styrene, copolymers of acrylonitrile, butadiene and styrene, polyvinyl alkyl ethers (in which examples of the alkyl group are a methyl group, an ethyl group, an isopropyl group, a butyl group, etc.), polymethyl vinyl ketone, polyethyl vinyl ketone, polyethylene, polypropylene, polybutene, polystyrene, poly-α-methylstyrene, polyamides (nylon-6, nylon-6,6, etc.), poly-1,3-butadiene, polyisoprene, polyurethane, polyethylene terephthalate, polyethylene isophthalate, chlorinated rubber, polychloroprene, ethyl cellulose, acetyl cellulose, polyvinyl butyral, polyvinyl formal, styrene-butadiene rubber, poly(chlorosulfonated ethylene), etc. In the case of copolymers, the monomer content ratio can be widely varied, but in general, it is suitable for the minor monomer component to range from about 10 to about 50% by weight. Thermoplastic high molecular weight materials other than those indicated above can also be employed in accordance with the present invention as long as the above described conditions are met.

Of the polymers described above, chlorinated polyethylene, chlorinated polypropylene, polymethyl methacrylate, polyvinyl chloride, vinyl chloride-vinylidene chloride copolymers (in which the molar content of vinyl chloride is about 20 to 80%), vinylidene chloride-acrylonitrile copolymers (in which the molar content of acrylonitrile is about 10 to 30%), vinyl chloride-acrylonitrile copolymers (in which the molar content of acrylonitrile is about 10 to 30%), polystyrene, polyvinyl butyral, polyvinyl acetate, polyvinyl formal, ethyl cellulose, acetyl cellulose, vinyl chloride-vinyl acetate copolymers, polychloroprene, polyisoprene, chlorinated rubber, poly(chlorosulfonated ethylene), etc., are preferred for use with the photopolymerizable composition of the present invention.

These polymers can be used individually or as a combination of two or more kinds of polymers which have sufficiently good compatibility that mixing during manufacturing steps of the preparation of coating solutions, coating and drying, in a suitable ratio is not destroyed. A suitable amount of the polymers (as a binder) which can be employed is about 0.1 to about 10 parts by weight, preferably about 0.2 to about 3 parts by weight, per part by weight of the monomer (ethylenic compound).

Specific examples of thermal polymerization inhibitors which can be used include p-methoxyphenol, hydroquinone, alkyl- or aryl substituted hydroquinones, t-butylcatechol, pyrogallol, cuprous chloride, phenothiazine, chloranil, naphthylamine, beta-naphthol, 2,6-di-t-butyl-p-cresol, pyridine, nitrobenzene, dinitrobenzene, p-toluidiene, methylene blue, organic acid copper salts (e.g., copper acetate, etc.), and the like. These thermal polymerization inhibitors are preferably employed in an amount ranging from about 0.001 part by weight to about 5 parts by weight to 100 parts by weight of the above described ethylenic compound (1). The thermal polymerization inhibitors can be used for the purpose of improving the stability of the composition in accordance with the present invention prior to exposure with the passage of time.

Specific examples of coloring agents include, for instance, pigments such as titanium oxide, carbon black, iron oxides, phthalocyanine type pigments, azo type pigments, etc., and dyes such as methylene blue, crystal violet, rhodamin B, fuchsin, auramine, azo type dyes, anthraquinone type dyes, etc. Use of coloring agents that do not absorb light in the absorption wavelength of the photopolymerization initiator is preferred. Such a coloring agent is preferably employed in a range of about 0.1 part by weight to about 30 parts by weight in the case of pigments and about 0.1 part by weight to about 10 parts by weight in the case of dyes, to 100 parts by weight of the total amount of the binder and the ethylenic compound, more preferably in a range of 0.1 part by weight to 3 parts by weight. Where the coloring agents described above are incorporated into the composition, it is preferred for dichloromethyl stearate and other chlorinated fatty acids, etc. to be employed as adjuvants for the coloring agents; and the amount of these materials can range from about 0.05 part by weight to about 0.5 part by weight per part by weight of the coloring agent.

Where plasticizers are incorporated into the photopolymerizable composition, it is unnecessary to incorporate adjuvants for the coloring agents. Typical examples of plasticizers include phthalic acid esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diallyl phthalate, etc.; glycol esters such as dimethylglycol phthalate, ethylphthalylethyl glycolate, methylphthalylethyl glycolate, butylphthalylbutyl glycolate, triethylene glycol dicaprylate, etc.; phosphoric acid esters such as tricresyl phosphate, triphenyl phosphate, etc.; aliphatic dicarboxylic acid esters such as diisobutyl adipate, dioctyl adipate, dimethyl sebacate, dibutyl sebacate, dioctyl azelate, dibutyl maleate, etc.; triethyl citrate, glycerin triacetyl ester, butyl laurate, etc. A suitable amount of the plasticizers which can be employed is about 0.5 to about 50% by weight, preferably about 1 to about 10% by weight, based on the weight of the binder.

Lanolin, paraffin wax, etc. can be used as surface smoothening agents. A suitable amount of the addenda (e.g., colorants, etc.) which can be employed is about 0.05 to about 30% by weight, preferably about 0.2 to about 2% by weight, based on the weight of the binder. Moreover, a suitable total amount of the plasticizers, colorants and other addenda is about 0.5 to about 50% by weight, preferably about 0.5 to about 10% by weight, based on the weight of the binder.

A variety of modifying agents which can be incorporated into the composition of the present invention depending upon the necessity can be employed in a range up to about 3 wt% based on the total weight of the photopolymerizable composition, preferably in an amount up to 1 wt%.

Most generally the photopolymerizable composition of the present invention is dissolved in a solvent to obtain a coating solution of the photopolymerizable composition and the resulting coating solution is coated onto a support in a conventional manner and then the solvent is removed. The thus obtained photopolymerizable light sensitive material is then ready for use.

Typical examples of solvents which can be used are ketones such as acetone, methyl ethyl ketone, methyl isobutyl ketone, cyclohexane, diisobutyl ketone, etc.; esters such as ethyl acetate, ethyl propionate, dimethyl phthalate, ethyl benzoate, etc.; aromatic hydrocarbons such as toluene, xylene, benzene, ethylbenzene, etc.; halogenated hydrocarbons such as carbon tetrachloride, trichloroethylene, chloroform, 1,1,1-trichloroethane, monochlorobenzene, chloronaphthalene, etc.; ethers such as tetrahydrofuran, diethyl ether, ethylene glycol monomethyl ether, ethylene glycol monoethyl ether acetate, etc.; dimethylformamide; dimethyl sulfoxide; etc.

Suitable supports to which the photopolymerizable composition of the present invention is applied (for example, in a solution form as mentioned above) include planar supports or other shape supports which do not undergo any substantial dimensional change. Typical examples of planar supports include glass, silicon oxide, ceramics, paper, metals such as aluminum, zinc, magnesium, copper, iron, chromium, nickel, silver, gold, palladium, platinum, alloys containing aluminum as a main component, alloys containing zinc as a main component, alloys containing magnesium as a main component, copper-zinc alloys, iron-nickel-chromium alloys, alloys containing copper as a main component, metallic compounds such as aluminum oxide, stannous oxide ($SnO_2$), indium oxide ($In_2O_3$); polymers such as regenerated cellulose, cellulose nitrate, cellulose diacetate, cellulose triacetate, cellulose acetate butyrate, cellulose acetate propionate polystyrene, polyethylene terephthalate, polyethylene isophthalate, polycarbonates of bisphenol A, polyethylene, polypropylene, nylons (nylon-6, nylon-6,6, nylon-6,10, etc.), polyvinyl chloride, vinyl chloride-vinyl acetate copolymers, vinyl chloride-acrylonitrile copolymers, vinyl acetate-vinylidene chloride copolymers, polyacrylonitrile, polymethyl acrylate, polymethyl methacrylate, etc. In addition, supports where at least two thin plates of the above-described materials are strongly laminated, e.g., cermet, an iron-aluminum laminate plate, an iron-copper-aluminum laminate plate, an iron-chromium-copper laminate plate, paper whose surface is coated with polyethylene, paper whose surface is coated with cellulose triacetate, an aluminum plate whose surface is anodized to form an aluminum oxide layer on the surface thereof, a chromium plate with a chromium oxide layer formed on the surface thereof in a conventional manner, a glass plate with a tin (IV) oxide layer on the surface thereof and a silicon dioxide plate with indium (III) oxide provided on the surface thereof can also be employed as a support.

These supports are selected depending upon whether the light sensitive image forming materials are to be used either as a transparent image forming material or an opaque image forming material. In the case of transparent supports, not only colorless transparent supports but also transparent supports colored by adding dyes or pigments as described in *J. SMPTE*, vol. 67, page 296

(1958), etc. can be employed. In the case of opaque supports, in addition to intrinsically transparent supports such as paper or metals, supports obtained by adding dyes or pigments such as titanium oxide, etc. to transparent supports, synthetic resin films surface treated in accordance with the method described in Japanese Patent Publication No. 19068/72 and fully light shielding papers produced by adding carbon black, etc. thereto, synthetic resin films and the like can also be employed. In addition, supports whose surface has been roughened by surface treatments such as graining, electrolytic etching, anodic oxidation, chemical etching, etc., and supports whose surface has been preliminarily treated using, e.g., a corona discharge, an ultraviolet light irradiation, a flame treatment, etc. can also be employed. Further, synthetic supports, whose strength is increased by incorporating reinforcing agents therein, such as glass fibers, carbon fibers, boron fibers, a variety of metal fibers, metal whiskers, etc. can also be employed.

Depending upon necessity, other coating layers which are required in order to make bonding easy, or an antihalation layer, an ultraviolet light absorbing layer and a visible light absorbing layer can be provided on the surface of the supports.

In addition, in order to prevent a radiation in sensitivity due to oxygen, the composition of the present invention can be exposed to light using a vacuum as described in U.S. Pat. No. 3,060,026; a transparent cover which is removable can be provided thereon; or a coating layer having a small oxygen permeability can be provided on the light sensitive layer as described in Japanese Patent Publication No. 17828/65.

Factors determining the speed at which the photopolymerizable composition of the present invention is photopolymerized, hardened and dried include the properties of the support, especially of the surface thereof; the particular components in the composition, the content of the photopolymerization initiator in the total photopolymerizable composition; the thickness of a layer of the photopolymerizable composition; the properties of the light sources (characteristics of spectrum irradiated); amount of actinic light; the presence or absence of oxygen; and the ambient temperature, etc.

Irradiation with light can be performed using a variety of methods or a combination thereof. For example, the composition can be exposed to any actinic radiation obtained from any type of light sources as long as an effective amount of exposure is applied. This is because the photopolymerizable composition of the present invention exhibits a maximum sensitivity in the areas of ultraviolet light as well as visible light in the wavelength range of about 180 nm to about 600 nm, in general. However, the composition of the present invention possesses sensitivity even to vacuum ultraviolet light, X-rays, electromagnetic waves and electron rays of a short wavelength in the range of gamma rays, particle rays such as neutron beams and α-rays, etc. so that these types of radiation can also be utilized for imagewise exposure. Specific examples of suitable ultraviolet as well as visible light sources include a carbon arc lamp, a mercury vapor lamp, a xenon lamp, a fluorescent lamp, an argon glow discharge tube, a flood lamp for photography and a van de Graaff accelerator, etc.

The time period of irradiation should be sufficient to provide an effective amount of light. The irradiation can be performed at any temperature, but from a practical standpoint, room temperature, i.e., 10° C. to 40° C. is preferred.

The composition in accordance with the present invention which is hardened by light is dry and flexible; is abrasion resistant as well as resistant to chemicals; possesses excellent ink receptivity, hydrophilic-hydrophobic balance, stain removal characteristics, initial roll-up properties, etc.; and is suitable for use as materials for printing plates for lithography which have been previously rendered light sensitive, etc. as well as photoresists, etc. Needless to say, the composition of the present invention can also be employed as a printing ink; an adhesive for metal foils, films, paper, textiles, etc.; photohardenable paints used for metals, plastics, paper, woods, metal foils, textiles, glass, thick paper, thick paper for cardboards, road markings, parking areas, airports, and the like.

When the composition of the present invention is employed, for example, as a vehicle for a printing ink, it can be colored with a known amount of dyes and, at the same time, colored with a variety of known organic pigments, for example, molybdate orange, titanium white, chromium yellow, phthalocyanine blue, carbon black, etc. The amount of the vehicle which can be employed ranges from about 20 to about 99.9% of the total weight of the composition and the amount of the coloring agent ranges from about 0.1 to 80 wt%. Printing materials also include paper, clay coated paper and thick paper for manufacturing cardboards.

The composition of the present invention is also suitable for treating textiles such as natural fibers and synthetic fibers for example, it can be used as a vehicle for cloth printing ink or as a vehicle used for special treatments for textiles to render them water proof, oil proof, stain proof, crease resistant, etc.

In using the composition of the present invention as an adhesive, at least one of the adherends should be semi-transparent to ultraviolet or visible light. Representative examples of laminates which are obtained by adhering substrates using the composition of the present invention are cellophane covered with polymers, e.g., cellophane covered with polypropylene, etc.; metals such as aluminum or copper, etc. covered with a polyethylene terephthalate film, aluminum covered with polypropylene, etc.

The composition of the present invention which is photohardenable can be employed as a paint or for printing on the surface of metals, glass or plastics by means of roller coating or spray coating. In addition, color coating techniques can also be applied to glass, polyester films, vinyl polymer films, polymer-covered cellophane, treated or untreated polyethylene as well as treated or untreated polypropylene for cups and bottles. Examples of metals which may be coated also include sized or unsized tin plates.

The photopolymerizable light sensitive image forming material which is prepared from the photohardenable composition of the present invention is a material comprising a sheet-like or plate-like support with a layer comprising the composition of the present invention as a light sensitive element on the surface thereof.

One embodiment of the light sensitive image forming material using the composition of the present invention comprises a support having on the surface thereof a layer of the composition of the present invention and further having thereon a transparent synthetic resin film. In a material having this structure, the transparent synthetic resin film can be peeled off immediately before imagewise exposure. In addition, the light sensitive image forming material can be particularly advantageously employed as a material of the so called peeling off development type which comprises imagewise exposing through the transparent synthetic film while the transparent synthetic resin film is in place, or through the support where the support is transparent. Thereafter the transparent synthetic resin film is peeled off and the areas hardened due the exposure remain on the support and the unhardened areas remain on the transparent synthetic resin film (Alternatively, the layer of the areas hardened by exposure remain on the transparent synthetic resin film whereas the layer of the unexposed and unhardened areas remain on the support).

Imagewise exposure of the light sensitive image forming material using the composition of the present invention is completed on exposure of a specific portion of a layer of the photopolymerizable composition to light until addition polymerization at the irradiated portions reaches the desired thickness. Then, the unexposed areas of the layer of the composition are removed using a solvent which does not dissolve the polymers but dissolves only the ethylenic compound (monomer) or the prepolymers, or using the so-called peeling off development. In case that the photopolymerizable composition which contains the photopolymerization initiator of this invention is employed in light sensitive image copying materials, the thickness after the removal (drying) of the solvent from the photohardenable composition ranges from about 2 μm to abot 150 μm, preferably 3 μm to 100 μm. The flexibility is reduced as the thickness of the layer is increased, whereas abrasion resistance is reduced as the thickness of the layer is decreased.

Where the photopolymerizable compositon of this invention is used as a printing ink, a paint composition or an adhesive, the composition of the present invention can employed without using any volative solvents. In this case, the composition of the present invention has several advantages over conventional oil-containing resinous and solvent type inks or paints.

The present invention is explained in greater detail by reference to Examples 1 to 66 and Comparison Examples 1 to 45 below. The light sensitive materials in the respective examples were prepared using the methods and procedures indicated below. Unless otherwise indicated herein, all parts, percents, ratios and the like are by weight.

(1) Preparation of Light Sensitive Material

The ethylenic compound, the photopolymerization initiator and a binder were charged into a vessel together with 500 parts by weight of dichloroethane (solvent). The mixture was stirred for 3 hrs. to dissolve. The resulting solution was coated onto an aluminum plate with a spinner (rotary coating machine), and was dried at 80° C. for 10 mins. to form a light sensitive layer (layer of the photopolymerizable composition). The dry thickness of the light sensitive layer was about 10 μm.

(2) Measurement of Sensitivity of Light Sensitive Material

An optical wedge (number of optical density of steps: 0 to 15 steps) was placed on the light sensitive layer of the light sensitive material, which was exposed for 15 secs. at a distance of 50 cm. from the light source (mercury lamp; output: 2 kw). Thereafter, the light sensitive layer was treated with 1,1,1-trichloroethane for 30 secs. The maximum number of steps of the optical wedge corresponding to the image formed is expressed as the sensitivity of samples. The higher the number of steps, the higher the sensitivity.

The following materials were used as a binder for the light sensitive composition.

Chlorinated polyethylene: a high molecular weight material having a viscosity of about 90 cps at 25° C. in a 40 wt% toluene solution and having a chlorine content of about 66 wt% or more.

Methyl polymethacrylate: a high molecular weight material having a limiting viscosity of:

$$[\eta]_{MEK}^{30°\,C.} = 0.282$$

at 30° C. in a methyl ethyl ketone solution.

TABLE 2

| Component of Photopolymerizable Composition | Comparison Example | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| (1) Ethylenic Compound: | | | | | | | | | | | | | | | | | | |
| Pentaerythritol trimethacrylate | 50 | 50 | 50 | 50 | 50 | 50 | 50 | 50 | 50 | 50 | 50 | 50 | 50 | 50 | 50 | 50 | 50 | — |
| Oligoester acrylate | — | — | — | — | — | — | — | — | — | — | — | — | — | — | — | — | — | 50 |
| (Aronix: tradename made by Toa Gosei Co., Ltd.) | | | | | | | | | | | | | | | | | | |
| (2) Photopolymerization Initiator: | | | | | | | | | | | | | | | | | | |
| Component (a): | | | | | | | | | | | | | | | | | | |
| Benzanthrone | 5 | — | — | — | — | — | — | — | — | — | — | — | — | — | — | — | — | — |
| 1,2-Benzanthraquinone | — | 5 | — | — | — | — | — | — | — | — | — | — | — | — | — | — | — | — |
| Fluorenone | — | — | 5 | — | — | — | — | — | — | — | — | — | — | — | — | — | — | — |
| Component (b): | | | | | | | | | | | | | | | | | | |
| General Formula (I): | | | | | | | | | | | | | | | | | | |
| p-Dimethylaminostyryl methyl ketone | — | — | — | 5 | — | — | — | — | — | — | — | — | — | — | — | — | — | — |
| p-Dimethylaminostyryl ethyl ketone | — | — | — | — | 5 | — | — | — | — | — | — | — | — | — | — | — | — | — |
| p-Dimethylaminostyryl propyl ketone | — | — | — | — | — | 5 | — | — | — | — | — | — | — | — | — | — | — | — |
| p-Dimethylaminostyryl butyl ketone | — | — | — | — | — | — | 5 | — | — | — | — | — | — | — | — | — | — | — |
| p-Dimethylaminostyryl isobutyl ketone | — | — | — | — | — | — | — | 5 | — | — | — | — | — | — | — | — | — | — |
| p-Dimethylaminostyryl tert-butyl ketone | — | — | — | — | — | — | — | — | 5 | — | — | — | — | — | — | — | — | — |
| p-Dimethylaminostyryl cyclohexyl methyl ketone | — | — | — | — | — | — | — | — | — | 5 | — | — | — | — | — | — | — | — |
| p-Dimethylaminostyryl phenethyl ketone | — | — | — | — | — | — | — | — | — | — | 5 | — | — | — | — | — | — | — |
| Ethyl p-dimethylamino cinnamate | — | — | — | — | — | — | — | — | — | — | — | 5 | — | — | — | — | — | — |
| p-Dimethylaminostyryl 4-pyridyl ketone | — | — | — | — | — | — | — | — | — | — | — | — | 5 | — | — | — | — | — |
| p-Dimethylaminostyryl 2-thienyl ketone | — | — | — | — | — | — | — | — | — | — | — | — | — | 5 | — | — | — | — |
| p-Dimethylaminostyryl 9-anthlyl ketone | — | — | — | — | — | — | — | — | — | — | — | — | — | — | 5 | — | — | — |
| General formula (II): | | | | | | | | | | | | | | | | | | |
| 2-(p-Dimethylaminobenzylidene)cyclohexanone | — | — | — | — | — | — | — | — | — | — | — | — | — | — | — | 5 | — | — |

TABLE 2-continued

| Component of Photopolymerizable Composition | Comparison Example | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| 2-(p-Dimethylaminobenzylidene)cyclopentanone | — | — | — | — | — | — | — | — | — | — | — | — | — | — | — | — | 5 | — |
| (3) Binder: | | | | | | | | | | | | | | | | | | |
| Chlorinated polyethylene | 45 | 45 | 45 | 45 | 45 | 45 | 45 | 45 | 45 | 45 | 45 | 45 | 45 | 45 | 45 | 45 | 45 | 45 |
| Polymethyl methacrylate | — | — | — | — | — | — | — | — | — | — | — | — | — | — | — | — | — | — |
| Maximum Sensitivity of Optical Wedge Corresponding to Image Obtained: | 2 | 2 | 1 | 1 | 0 | 1 | 3 | 2 | 1 | 0 | 3 | 1 | 1 | 3 | 3 | 0 | 2 | 4 |

TABLE 3

| Component of Photopolymerizable Composition | Example | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| (1) Ethylenic Compound: | | | | | | | | | | | | | | |
| Pentaerythritol trimethacrylate | 50 | 50 | 50 | 50 | 50 | 50 | 50 | 50 | 50 | 50 | 50 | 50 | 50 | 50 |
| Oligoester acrylate (Aronix: tradename made by Toa Goesi Co., Ltd.) | — | — | — | — | — | — | — | — | — | — | — | — | — | — |
| (2) Photopolymerization Initiator: | | | | | | | | | | | | | | |
| Component (a): | | | | | | | | | | | | | | |
| Benzanthrone | 3 | 3 | 3 | 3 | 3 | 3 | 3 | 3 | 3 | 3 | 3 | 3 | 3 | 3 |
| 1,2-Benzanthraquinone | — | — | — | — | — | — | — | — | — | — | — | — | — | — |
| Fluorenone | — | — | — | — | — | — | — | — | — | — | — | — | — | — |
| Component (b): | | | | | | | | | | | | | | |
| General Formula (I): | | | | | | | | | | | | | | |
| p-Dimethylaminostyryl methyl ketone | 2 | — | — | — | — | — | — | — | — | — | — | — | — | — |
| p-Dimethylaminostyryl ethyl ketone | — | 2 | — | — | — | — | — | — | — | — | — | — | — | — |
| p-Dimethylaminostyryl propyl ketone | — | — | 2 | — | — | — | — | — | — | — | — | — | — | — |
| p-Dimethylaminostyryl butyl ketone | — | — | — | 2 | — | — | — | — | — | — | — | — | — | — |
| p-Dimethylaminostyryl isobutyl ketone | — | — | — | — | 2 | — | — | — | — | — | — | — | — | — |
| p-Dimethylaminostyryl tert-butyl ketone | — | — | — | — | — | 2 | — | — | — | — | — | — | — | — |
| p-Dimethylaminostyryl cyclohexyl methyl ketone | — | — | — | — | — | — | 2 | — | — | — | — | — | — | — |
| p-Dimethylaminostyryl phenethyl ketone | — | — | — | — | — | — | — | 2 | — | — | — | — | — | — |
| Ethyl p-dimethylamino cinnamate | — | — | — | — | — | — | — | — | 2 | — | — | — | — | — |
| p-Dimethylaminostyryl 4-pyridyl ketone | — | — | — | — | — | — | — | — | — | 2 | — | — | — | — |
| p-Dimethylaminostyryl 2-thienyl ketone | — | — | — | — | — | — | — | — | — | — | 2 | — | — | — |
| p-Dimethylaminostyryl 9-anthlyl ketone | — | — | — | — | — | — | — | — | — | — | — | 2 | — | — |
| General Formula (II): | | | | | | | | | | | | | | |
| 2-(p-Dimethylaminobenzylidene(cyclohexanone | — | — | — | — | — | — | — | — | — | — | — | — | 2 | — |
| 2-(p-Dimethylaminobenzylidene)cyclopentanone | — | — | — | — | — | — | — | — | — | — | — | — | — | 2 |
| (2) Binder: | | | | | | | | | | | | | | |
| Chlorinated polyethylene | 45 | 45 | 45 | 45 | 45 | 45 | 45 | 45 | 45 | 45 | 45 | 45 | 45 | 45 |
| Polymethyl methacrylate | — | — | — | — | — | — | — | — | — | — | — | — | — | — |
| Maximum Sensitivity of Optical Wedge Corresponding to Image Obtained: | 14 | 14 | 15 | 11 | 14 | 10 | 12 | 11 | 13 | 13 | 12 | 11 | 7 | 8 |

| Component of Photopolymerizable Composition | Example | | | | | | | | | | | | | |
|---|---|---|---|---|---|---|---|---|---|---|---|---|---|---|
| | 15 | 16 | 17 | 18 | 19 | 20 | 21 | 22 | 23 | 24 | 25 | 26 | 27 | 28 |
| (1) Ethylenic Compound: | | | | | | | | | | | | | | |
| Pentaerythritol trimethacrylate | 50 | 50 | 50 | 50 | 50 | — | — | — | — | — | 50 | 50 | 50 | 30 |
| Oligoester acrylate (Aronix: tradename made by Toa Goesi Co., Ltd.) | — | — | — | — | — | 50 | 50 | 50 | 50 | 50 | — | — | — | 20 |
| (2) Photopolymerization Initiator: | | | | | | | | | | | | | | |
| Component (a): | | | | | | | | | | | | | | |
| Benzathrone | — | — | — | — | 3 | 5 | — | 3 | — | — | 3 | 3 | — | 3 |
| 1,2-Benzanthraquinone | 3 | 3 | — | — | — | — | 5 | — | 3 | — | — | — | 3 | — |
| Fluorenone | — | — | 3 | 3 | — | — | — | — | — | 3 | — | — | — | — |
| Component (b): | | | | | | | | | | | | | | |
| General Formula (I): | | | | | | | | | | | | | | |
| p-Dimethylaminostyryl methyl ketone | 2 | — | — | — | — | — | — | — | — | — | — | — | — | — |
| p-Dimethylaminostyryl ethyl ketone | — | — | — | — | 1 | — | — | — | — | — | — | — | — | — |
| p-Dimethylaminostyryl propyl ketone | — | — | — | — | — | — | — | 2 | — | — | — | — | — | — |
| p-Dimethylaminostyryl butyl ketone | — | — | — | — | — | — | — | — | — | — | — | — | — | — |
| p-Dimethylaminostyryl isobutyl ketone | — | — | — | — | — | — | — | — | 2 | — | — | — | — | 2 |
| p-Dimethylaminostyryl tert-butyl ketone | — | — | 2 | — | — | — | — | — | — | — | — | 2 | — | — |
| p-Dimethylaminostyryl cyclohexyl methyl ketone | — | — | — | — | — | — | — | — | — | 2 | — | — | — | — |
| p-Dimethylaminostyryl phenethyl ketone | — | — | — | — | 1 | — | — | — | — | — | — | — | — | — |
| Ethyl p-dimethylamino cinnamate | — | 2 | — | — | — | — | — | — | — | — | — | — | — | — |
| p-Dimethylaminostyryl 4-pyridyl ketone | — | — | — | — | — | — | — | — | — | — | 2 | — | — | — |
| p-Dimethylaminostyryl 2-thienyl ketone | — | — | — | — | — | — | — | — | — | — | — | — | — | — |
| p-Dimethylaminostyryl 9-anthlyl ketone | — | — | — | 2 | — | — | — | — | — | — | — | — | — | — |
| General Formula (II): | | | | | | | | | | | | | | |
| 2-(p-Dimethylaminobenzylidene(cyclohexanone | — | — | — | — | — | — | — | — | — | — | — | — | 2 | — |
| 2-(p-Dimethylaminobenzylidene)cyclopentanone | — | — | — | — | — | — | — | — | — | — | — | — | — | — |
| (3) Binder: | | | | | | | | | | | | | | |
| Chlorinated polyethylene | 45 | 45 | 45 | 45 | 45 | 45 | 45 | 45 | 45 | 45 | — | — | — | — |
| Polymethyl methacrylate | — | — | — | — | — | — | — | — | — | — | 45 | 45 | 45 | 45 |

TABLE 3-continued

| | | | | | | | | | | | | | | |
|---|---|---|---|---|---|---|---|---|---|---|---|---|---|---|
| Maximum Sensitivity of Optical Wedge Corresponding to Image Obtained: | 10 | 9 | 8 | 7 | 12 | 7 | 8 | 14 | 11 | 8 | 11 | 9 | 7 | 12 |

TABLE 4

| Component of Photopolymerizable Composition | Comparison Example | | | | | | | | | | | | | | | | | | |
|---|---|---|---|---|---|---|---|---|---|---|---|---|---|---|---|---|---|---|---|
| | 19 | 20 | 21 | 22 | 23 | 24 | 25 | 26 | 27 | 28 | 29 | 30 | 31 | 32 | 33 | 34 | 35 | 36 | 37 |
| (1) Ethylenic Compound: | | | | | | | | | | | | | | | | | | | |
| Pentaerythritol trimethacrylate | 50 | 50 | 50 | 50 | 50 | 50 | 50 | 50 | 50 | 50 | 50 | 50 | 50 | 50 | 50 | 50 | 50 | 50 | 50 |
| Oligoester acrylate (Aronix: tradename made by Toa Gosei Co., Ltd.) | — | — | — | — | — | — | — | — | — | — | — | — | — | — | — | — | — | — | — |
| (2) Photopolymerization Initiator: | | | | | | | | | | | | | | | | | | | |
| Component (a): | | | | | | | | | | | | | | | | | | | |
| Benzanthrone | 5 | — | — | — | — | — | — | — | — | — | — | — | — | — | — | — | — | — | — |
| 1,2-Benzanthraquinone | — | 5 | — | — | — | — | — | — | — | — | — | — | — | — | — | — | — | — | — |
| Fluorenone | — | — | 5 | — | — | — | — | — | — | — | — | — | — | — | — | — | — | — | — |
| Component (b): | | | | | | | | | | | | | | | | | | | |
| General Formula (III): | | | | | | | | | | | | | | | | | | | |
| p-Dimethylaminochalcone | — | — | — | 5 | — | — | — | — | — | — | — | — | — | — | — | — | — | — | — |
| p-Dimethylamino-m'-chlorochalcone | — | — | — | — | 5 | — | — | — | — | — | — | — | — | — | — | — | — | — | — |
| p-Dimethylamino-p'-bromochalcone | — | — | — | — | — | 5 | — | — | — | — | — | — | — | — | — | — | — | — | — |
| p-Dimethylamino-p'-cyanochalcone | — | — | — | — | — | — | 5 | — | — | — | — | — | — | — | — | — | — | — | — |
| p-Dimethylamino-p'-methoxychalcone | — | — | — | — | — | — | — | 5 | — | — | — | — | — | — | — | — | — | — | — |
| p-Dimethylamino-p'-methylchalcone | — | — | — | — | — | — | — | — | 5 | — | — | — | — | — | — | — | — | — | — |
| p-Dimethylamino-m'-methylchalcone | — | — | — | — | — | — | — | — | — | 5 | — | — | — | — | — | — | — | — | — |
| p-Dimethylamino-m'-bromochalcone | — | — | — | — | — | — | — | — | — | — | 5 | — | — | — | — | — | — | — | — |
| General formula (IV): | | | | | | | | | | | | | | | | | | | |
| p'-Dimethylaminochalcone | — | — | — | — | — | — | — | — | — | — | — | 5 | — | — | — | — | — | — | — |
| p-Cyano-p'-dimethylaminochalcone | — | — | — | — | — | — | — | — | — | — | — | — | 5 | — | — | — | — | — | — |
| m-Chloro-p'dimethylaminochalcone | — | — | — | — | — | — | — | — | — | — | — | — | — | 5 | — | — | — | — | — |
| p-Bromo-p'dimethylaminochalcone | — | — | — | — | — | — | — | — | — | — | — | — | — | — | 5 | — | — | — | — |
| p-Methyl-p'dimethylaminochalcone | — | — | — | — | — | — | — | — | — | — | — | — | — | — | — | 5 | — | — | — |
| m-Methyl-p'dimethylaminochalcone | — | — | — | — | — | — | — | — | — | — | — | — | — | — | — | — | 5 | — | — |
| p-Methoxy-p'-dimethylaminochalcone | — | — | — | — | — | — | — | — | — | — | — | — | — | — | — | — | — | 5 | — |
| p,p'-bis(Dimethylamino)chalcone | — | — | — | — | — | — | — | — | — | — | — | — | — | — | — | — | — | — | 5 |
| (3) Binder: | | | | | | | | | | | | | | | | | | | |
| Chlorinated polyethylene | 45 | 45 | 45 | 45 | 45 | 45 | 45 | 45 | 45 | 45 | 45 | 45 | 45 | 45 | 45 | 45 | 45 | 45 | 45 |
| Methyl polymethacrylate | — | — | — | — | — | — | — | — | — | — | — | — | — | — | — | — | — | — | — |
| Maximum Sensitivity of Optical Wedge Corresponding to Image Obtained: | 2 | 2 | 1 | 1 | 0 | 3 | 3 | 1 | 1 | 0 | 3 | 2 | 1 | 2 | 1 | 1 | 2 | 2 | 1 |

TABLE 5

| Component of Photopolymerizable Composition | Example | | | | | | | | | | | | | |
|---|---|---|---|---|---|---|---|---|---|---|---|---|---|---|
| | 29 | 30 | 31 | 32 | 33 | 34 | 35 | 36 | 37 | 38 | 39 | 40 | 41 | 42 |
| (1) Ethylenic Compound: | | | | | | | | | | | | | | |
| Pentaerythritol trimethacrylate | 50 | 50 | 50 | 50 | 50 | 50 | 50 | 50 | 50 | 50 | 50 | 50 | 50 | 50 |
| Oligoester acrylate (Aronix: tradename made by Toa Gosei Co., Ltd.) | — | — | — | — | — | — | — | — | — | — | — | — | — | — |
| (2) Photopolymerization Initiator: | | | | | | | | | | | | | | |
| Component (a): | | | | | | | | | | | | | | |
| Benzanthrone | 3 | 3 | 3 | 3 | 3 | 3 | 3 | 3 | 3 | 3 | 3 | 3 | 3 | 3 |
| 1,2-Benzanthraquinone | — | — | — | — | — | — | — | — | — | — | — | — | — | — |
| Fluoronone | — | — | — | — | — | — | — | — | — | — | — | — | — | — |
| Component (b): | | | | | | | | | | | | | | |
| General Formula (III): | | | | | | | | | | | | | | |
| p-Dimethylaminochalcone | 2 | — | — | — | — | — | — | — | — | — | — | — | — | — |
| p-Dimethylamino-m'-chlorochalcone | — | 2 | — | — | — | — | — | — | — | — | — | — | — | — |
| p-Dimethylamino-p'-bromochalcone | — | — | 2 | — | — | — | — | — | — | — | — | — | — | — |
| p-Dimethylamino-p'-cyanochalcone | — | — | — | 2 | — | — | — | — | — | — | — | — | — | — |
| p-Dimethylamino-p'-methoxychalcone | — | — | — | — | 2 | — | — | — | — | — | — | — | — | — |
| p-Dimethylamino-p'-methylchalcone | — | — | — | — | — | 2 | — | — | — | — | — | — | — | — |
| p-Dimethylamino-m'-methylchalcone | — | — | — | — | — | — | 2 | — | — | — | — | — | — | — |
| p-Dimethylamino-m'-bromochalcone | — | — | — | — | — | — | — | 2 | — | — | — | — | — | — |
| General Formula (IV): | | | | | | | | | | | | | | |
| p'-Dimethylaminochalcone | — | — | — | — | — | — | — | — | 2 | — | — | — | — | — |
| p-Cyano-p'-dimethylaminochalcone | — | — | — | — | — | — | — | — | — | 2 | — | — | — | — |
| m-Chloro-p'-dimethylaminochalcone | — | — | — | — | — | — | — | — | — | — | 2 | — | — | — |
| p-Bromo-p'-dimethylaminochalcone | — | — | — | — | — | — | — | — | — | — | — | 2 | — | — |
| p-Methyl-p'-dimethylaminochalcone | — | — | — | — | — | — | — | — | — | — | — | — | 2 | — |
| m-Methyl-p'-dimethylaminochalcone | — | — | — | — | — | — | — | — | — | — | — | — | — | 2 |
| p-Methoxy-p'-dimethylaminochalcone | — | — | — | — | — | — | — | — | — | — | — | — | — | — |
| p,p'-bis(Dimethylamino)chalcone | — | — | — | — | — | — | — | — | — | — | — | — | — | — |
| (3) Binder: | | | | | | | | | | | | | | |
| Chlorinated polyethylene | 45 | 45 | 45 | 45 | 45 | 45 | 45 | 45 | 45 | 45 | 45 | 45 | 45 | 45 |

TABLE 5-continued

| | | | | | | | | | | | | | | |
|---|---|---|---|---|---|---|---|---|---|---|---|---|---|---|
| Methyl polymethacrylate | — | — | — | — | — | — | — | — | — | — | — | — | — | — |
| Maximum Sensitivity of Optical Wedge Corresponding to Image Obtained: | 12 | 13 | 14 | 13 | 14 | 14 | 13 | 8 | 11 | 11 | 11 | 11 | 11 | 10 |

| | Example | | | | | | | | | | | | | |
|---|---|---|---|---|---|---|---|---|---|---|---|---|---|---|
| Component of Photopolymerizable Composition | 43 | 44 | 45 | 46 | 47 | 48 | 49 | 50 | 51 | 52 | 53 | 54 | 55 | 56 |
| (1) Ethylenic Compound: | | | | | | | | | | | | | | |
| Pentaerythritol trimethacrylate | 50 | 50 | 50 | 50 | 50 | 50 | 50 | — | — | — | 50 | 50 | 50 | 50 |
| Oligoester acrylate | — | — | — | — | — | — | — | 50 | 50 | 50 | — | — | — | — |
| (Aronix: tradename made by Toa Gosei Co., Ltd.) | | | | | | | | | | | | | | |
| (2) Photopolymerization Initiator: | | | | | | | | | | | | | | |
| Component (a): | | | | | | | | | | | | | | |
| Benzanthrone | 3 | 3 | 3 | 15 | 3 | 3 | 3 | 3 | 3 | 3 | — | — | — | — |
| 1,2-Benzanthraquinone | — | — | — | 15 | — | — | — | — | — | — | 3 | 3 | — | — |
| Fluorenone | — | — | — | — | — | — | — | — | — | — | — | — | 3 | 3 |
| Component (b): | | | | | | | | | | | | | | |
| General Formula (III): | | | | | | | | | | | | | | |
| p-Dimethylaminochalcone | — | — | 1 | — | — | — | — | — | — | — | — | — | — | — |
| -chlorochalcone | — | — | — | — | 1 | — | — | — | — | — | — | — | — | — |
| p-Dimethylamino-p'-bromochalcone | — | — | — | 2 | — | — | — | — | — | — | — | — | — | — |
| p-Dimethylamino-p'-cyanochalcone | — | — | — | — | — | — | — | 2 | — | — | — | — | — | — |
| p-Dimethylamino-p'-methoxychalcone | — | — | — | — | — | 2 | — | — | — | — | — | — | — | — |
| p-Dimethylamino-p'-methylchalcone | — | — | — | — | 1 | — | — | — | — | — | — | — | 2 | — |
| p-Dimethylamino-m'-methylchalcone | — | — | — | — | — | — | — | — | — | — | 2 | — | — | — |
| p-Dimethylamino-m'-bromochalcone | — | — | — | — | — | — | — | — | — | — | — | — | — | — |
| General Formula (IV): | | | | | | | | | | | | | | |
| p'-Dimethylaminochalcone | — | — | — | — | — | — | — | — | — | — | — | — | — | — |
| p-Cyano-p'-dimethylaminochalcone | — | — | 1 | — | — | — | 2 | — | — | — | — | — | — | — |
| m-Chloro-p'-dimethylaminochalcone | — | — | — | — | — | — | — | — | — | — | — | 2 | — | — |
| p-Bromo-p'-dimethylaminochalcone | — | — | — | — | — | — | — | 2 | — | — | — | — | — | — |
| p-Methyl-p'-dimethylaminochalcone | — | — | — | — | — | — | — | — | 2 | — | — | — | — | — |
| m-Methyl-p'-dimethylaminochalcone | — | — | — | — | — | — | — | — | 2 | — | — | — | — | 2 |
| p-Methoxy-p'-dimethylaminochalcone | 2 | — | — | — | — | — | — | — | — | — | — | — | — | — |
| p,p'-bis(Dimethylamino)chalcone | — | 2 | — | — | — | — | — | — | — | — | — | — | — | — |
| (3) Binder: | | | | | | | | | | | | | | |
| Chlorinated polyethylene | 45 | 45 | 45 | 45 | 45 | — | — | 45 | 45 | — | 45 | 45 | 45 | 45 |
| Methyl polymethacrylate | — | — | — | — | — | 45 | 45 | — | — | 45 | — | — | — | — |
| Maximum Sensitivity of Optical Wedge Corresponding to Image Obtained: | 11 | 11 | 12 | 13 | 12 | 10 | 11 | 12 | 12 | 12 | 8 | 8 | 6 | 6 |

TABLE 6

| | Comparison Example | | | | | | | |
|---|---|---|---|---|---|---|---|---|
| Component of Photopolymerizable Composition | 38 | 39 | 40 | 41 | 42 | 43 | 44 | 43 |
| (1) Ethylenic Compound: | | | | | | | | |
| Pentaerythritol trimethacrylate | 50 | 50 | 50 | 50 | 50 | 50 | 50 | — |
| Oligoester acrylate | — | — | — | — | — | — | — | 50 |
| (Aronix: tradename made by Toa Gose Co., Ltd.) | | | | | | | | |
| Photopolymerization Initiator: | | | | | | | | |
| Component (a): | | | | | | | | |
| Benzanthrone | — | — | — | — | — | — | — | 5 |
| 1,2-Benzanthraquinone | — | — | — | — | — | — | — | — |
| Fluorenone | — | — | — | — | — | — | — | — |
| Component (b): | | | | | | | | |
| p-Dimethylaminostyryl p-methylstyryl ketone | 5 | — | — | — | — | — | — | — |
| p-Dimethylaminostyryl p-chlorostyryl ketone | — | 5 | — | — | — | — | — | — |
| p-Dimethylaminostyryl p-methoxystyryl ketone | — | — | 5 | — | — | — | — | — |
| p-Dimethylaminostyryl p-cyanostyryl ketone | — | — | — | 5 | — | — | — | — |
| p-Dimethylaminostyryl p-bromostyryl ketone | — | — | — | — | 5 | — | — | — |
| p-Dimethylaminostyryl m-methylstyryl ketone | — | — | — | — | — | 5 | — | — |
| bis(p-Dimethylaminostyryl)ketone | — | — | — | — | — | — | 5 | — |
| (3) Binder: | | | | | | | | |
| Chlorinated polyethylene | 45 | 45 | 45 | 45 | 45 | 45 | 45 | 45 |
| Polymethyl methacrylate | — | — | — | — | — | — | — | — |
| Maximum Sensitivity of Optical Wedge Corresponding to Image Obtained: | 7 | 8 | 8 | 7 | 9 | 9 | 4 | 6 |

TABLE 7

| | Example | | | | | | | | | |
|---|---|---|---|---|---|---|---|---|---|---|
| Component of Photopolymerizable Composition | 57 | 58 | 59 | 60 | 61 | 62 | 63 | 64 | 65 | 66 |
| (1) Ethylenic Compound: | | | | | | | | | | |
| Pentaerythritol trimethacrylate | 50 | 50 | 50 | 50 | 50 | 50 | 50 | — | — | 50 |
| Oligoester acrylate | — | — | — | — | — | — | — | 50 | 50 | — |

TABLE 7-continued

| Component of Photopolymerizable Composition | Example | | | | | | | | | |
|---|---|---|---|---|---|---|---|---|---|---|
| | 57 | 58 | 59 | 60 | 61 | 62 | 63 | 64 | 65 | 66 |
| (Aronix: tradename made by Toa Gosei Co., Ltd.) | | | | | | | | | | |
| (2) Photopolymerization Initiator: | | | | | | | | | | |
| Component (a): | | | | | | | | | | |
| Benzanthrone | 3 | 3 | 3 | 3 | 3 | 3 | 3 | 3 | — | — |
| 1,2-Benzanthraquinone | — | — | — | — | — | — | — | — | 3 | — |
| Fluorenone | — | — | — | — | — | — | — | — | — | 3 |
| Component (b): | | | | | | | | | | |
| p-Dimethylaminostyryl p-methylstyryl ketone | 2 | — | — | — | — | — | — | 2 | — | 2 |
| p-Dimethylaminostyryl p-chlorostyryl ketone | — | 2 | — | — | — | — | — | — | — | — |
| p-Dimethylaminostyryl p-methoxystyryl ketone | — | — | 2 | — | — | — | — | — | — | — |
| p-Dimethylaminostyryl p-cyanostyryl ketone | — | — | — | 2 | — | — | — | — | — | — |
| p-Dimethylaminostyryl p-bromostyryl ketone | — | — | — | — | 2 | — | — | — | — | — |
| p-Dimethylaminostyryl m-methylstyryl ketone | — | — | — | — | — | 2 | — | — | 2 | — |
| bis(p-Dimethylaminostyryl)ketone | — | — | — | — | — | — | 2 | — | — | — |
| (3) Binder: | | | | | | | | | | |
| Chlorinated polyethylene | 45 | 45 | 45 | 45 | 45 | 45 | 45 | 45 | 45 | — |
| Polymethyl methacrylate | — | — | — | — | — | — | — | — | — | 45 |
| Maximum Sensitivity of Optical Wedge Corresponding to Image Obtained: | 13 | 12 | 14 | 13 | 11 | 13 | 13 | 12 | 11 | 11 |

As can be seen from the results shown in Tables 2 through 7 above, in photopolymerizable compositions using pentaerythritol trimethacrylate as the ethylenic compound (Examples 1 through 19, 25 through 49, 53 through 63 and 67, and Comparison Examples 1 through 17 and 19 through 44), the photopolymerizable compositions using as the photopolymerization initiator (a) aromatic carbonyl compounds and (b) dialkylamino aromatic carbonyl compounds in combination provide much higher sensitivity as compared with photopolymerizable compositions using as the photopolymerization initiator aromatic carbonyl compounds alone, Component (a), or dialkylamino aromatic carbonyl compounds alone, Component (b). It is apparent that, while the photopolymerizable composition using Component (b) alone represented by the general formula (V) as the photopolymerization initiator as shown in Comparison Examples 38 to 44 exhibit quite a high sensitivity, the photopolymerizable compositions using as the photopolymerization initiator Component (a) and Component (b) represented by the general formula (V) in combination provide a much higher sensitivity. In addition, also in the photopolymerizable compositions using oligo-ester acrylates as the ethylenic compound (Examples 20 to 24, 50 to 52, 64 and 65, and Comparison Examples 18 and 45), it is apparent that the photopolymerizable compositions using Component (a) and Component (b) in combination exhibit a much higher sensitivity as compared with photopolymerizable compositions using Component (a) alone as the photopolymerization initiator. It is apparent that inter alia the sensitivity of the photopolymerizable compositions using the photopolymerization initiator comprising, in combination, benzanthrone or 1,2-benzanthraquinone or a mixture thereof as the aromatic carbonyl compound, and p-dimethylaminostyryl methyl ketone, p-dimethylaminostyryl ethyl ketone, p-dimethylaminostyryl isobutyl ketone, ethyl p-dimethylaminocinnamate, p-dimethylaminostyryl 4-pyridyl ketone, p-dimethylamino-m'-chlorochalcone, p-dimethylamino-p'-bromochalcone, p-dimethylamino-p'-cyanochalcone, p-dimethylamino-p'-methoxychalcone, p-dimethylamino-m-methylchalcone, p-dimethylaminostyryl-p-methylstyryl ketone, p-dimethylaminostyryl p-methoxystyryl ketone, p-dimethylaminostyryl p-cyanostyryl ketone, p-dimethylaminostyryl m-methylstyryl ketone or bis(p-dimethylaminostyryl) ketone as the p-dialkylamino aromatic carbonyl compound is particularly high.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising, as essential components,
   (1) an addition polymerizable compound having at least one ethylenically unsaturated double bond, and
   (2) a photopolymerization initiator, said photopolymerization initiator comprising a combination of:
      (a) at least one aromatic carbonyl compound selected from the group consisting of benzanthrone, 1,2-benzanthraquinone, fluorenone and mixtures thereof, and
      (b) at least one p-dialkylamino aromatic carbonyl compound selected from the group consisting of compounds represented by the general formulae (I) through (V):

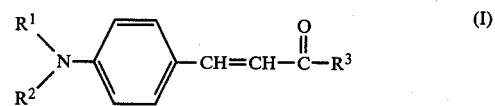

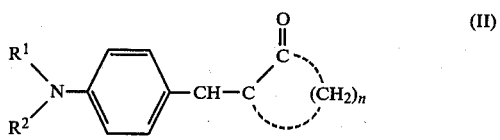

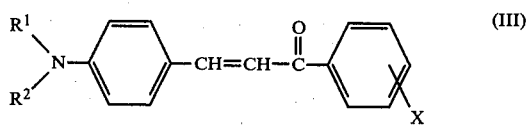

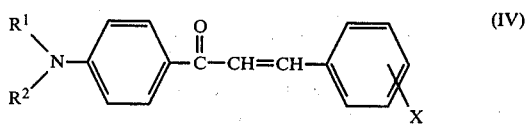

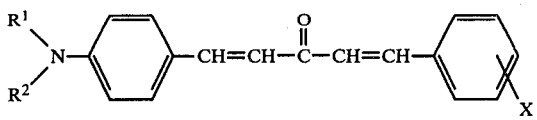

(V)

wherein $R^1$ and $R^2$, which may be the same or different, each represents an alkyl group; $R^3$ represents an alkyl group, an aryl group selected from the class consisting of a residue of a benzene ring, a residue of a condensed system of a benzene ring and a 5-membered unsaturated ring, and a residue formed by substituting on the ring forming carbon atoms of these residues one or more substituents selected from the class consisting of a halogen atom, a nitro group, an amino group, a substituted amino group, a cyano group, an alkyl group, a haloalkyl group, an alkoxy group, an aryloxy group, an alkoxycarbonyl group, and acyloxy group and an alkoxysulfonyl group, an aralkyl group, an alkoxy group, an aryloxy group, or a monovalent residue of a 5-membered or 6 membered heterocyclic aromatic ring containing one or more of a nitrogen atom, an oxygen atom and a sulfur atom as heteroatoms; n represents a positive integer of 3 to 8; and X represents a substituent having a Hammett sigma constant in the range of −0.9 to +0.7.

2. The photopolymerizable composition of claim 1, wherein said p-dialkylamino aromatic carbonyl compound (b) is at least one compound selected from the group consisting of compounds represented by the general formulae (I) and (II).

3. The photopolymerizable composition of claim 1, wherein said aromatic carbonyl compound (a) is benzanthrone, 1,2-benzanthraquinone or a mixture thereof.

4. The photopolymerizable composition of claim 1, wherein said aromatic carbonyl compound (a) is benzanthrone, 1,2-benzanthraquinone or a mixture thereof; and said p-dialkylaminoaromatic carbonyl compound (b) is p-dimethylaminostyryl methyl ketone, p-dimethylaminostyryl ethyl ketone, p-dimethylaminostyryl propyl ketone, p-dimethylaminostyryl isopropyl ketone, ethyl p-dimethylaminocinnamate, p-dimethylaminostyryl 4-pyridyl ketone, p-dimethylamino-m'-chlorochalcone, p-dimethylamino-p'-bromochalcone, p-dimethylamino-p'-cyanochalcone, p-dimethylamino-p'-methoxychaclone, p-dimethylamino-p'-methylchalcone, p-dimethylamino-m'-methylchalcone, p-dimethylaminostyryl p-methylstyryl ketone, p-dimethylaminostyryl p-methoxystyryl ketone, p-dimethylaminostyryl p-cyanostyryl ketone, p-dimethylaminostyryl m-methylstyryl ketone or bis(p-dimethylaminostyryl) ketone.

5. The photopolymerizable composition of claim 1, wherein said at least one p-dialkylamino aromatic carbonyl compound is selected from the group consisting of p-dimethylaminostyryl methyl ketone, p-dimethylaminostyryl ethyl ketone, p-dimethylaminostyryl propyl ketone, p-dimethylaminostyryl butyl ketone, p-dimethylaminostyryl isobutyl ketone, p-dimethylaminostyryl tert-butyl ketone, p-dimethylaminostyryl cyclohexyl ketone, p-dimethylaminostyryl benzyl ketone, p-dimethylaminostyryl phenethyl ketone, methyl p-dimethylaminocinnamate ester, ethyl p-diamethylaminocinnamate, p-dimethylaminostyr-1 2-pyridyl ketone, p-dimethylaminostyryl 4-pyridyl ketone, p-dimethylaminostyryl 2-thienyl ketone, p-dimethylaminostyryl 9-anthryl ketone, p-diethylaminostyryl methyl ketone, p-diethylaminostyryl ethyl ketone, p-diethylaminostyryl butyl ketone, 2-(p-dimethylaminobenzylidene)cyclohexanone, 2-(p-dimethylaminobenzylidene)cyclopentanone, 2-(p-diethylaminobenzylidene)cyclohexanone, 2-(p-diethylaminobenzylidene)cyclopentanone, p-dimethylaminochalcone, p-dimethylamino-p'-cyanochalcone, p-dimethylamino-p'-chlorochalcone, p-dimethylamino-m'-chlorochalcone, p-dimethylamino-p'-bromochalcone, p-dimethylamino-m'-bromochalcone, p-dimethylamino-p'-methylchalcone, p-dimethylamino-m'-methylchalcone, p-dimethylamino-p'-ethylchalcone, p-dimethylamino-m'-ethylchalcone, p-dimethylamino-p'-methoxychalcone, p-dimethylamino-m'-methoxychalcone, p-dimethylamino-p'-ethoxychalcone, p-dimethylamino-m'-ethoxychalcone, p-dimethylamino-p'-dimethylaminochalcone, p-diethylaminochalcone, p-diethylamino-p'-cyanochalcone, p-diethylamino-m'-chlorochalcone, p-diethylamino-p'-chlorochalcone, p-diethylamino-m'-bromochalcone, p-diethylamino-p'-bromochalcone, p-diethylamino-m'-methylchalcone, p-diethylamino-p'methylchalcone, p-diethylamino-m'-ethylchalcone, p-diethylamino-p'-methylchalcone, p-diethylamino-p'-ethoxychalcone, p-diethylamino-m'-methoxychalcone, p-diethylamino-p'-diethylaminochalcone, p'-dimethylaminochalcone, p-cyano-p'-dimethylaminochalcone, p-chloro-p'-dimethylaminochalcone, m-chloro-p'-dimethylaminochalcone, m-bromo-p'-dimethylaminochalcone, p-bromo-p'-dimethylaminochalcone, m-methyl-p'-dimethylaminochalcone, p-methyl-p'-dimethylaminochalcone, m-ethyl-p'-dimethylaminochalcone, p-ethyl-p'-dimethylaminochalcone, m-methocy-p'-dimethylaminochalcone, p-methoxy-p'-dimethylaminochalcone, m-ethoxy-p'-dimethylaminochalcone, p-ethoxy-p'-dimethylaminochalcone, p,p'-bis(dimethylamino)chalcone, p,p'40 -bis(diethylamino)-chalcone, p'-diethylaminocalchone, p-cyano-p'-diethylaminochalcone, p-chloro-p'-diethylaminochalcone, m-bromo-p'-diethylaminochalcone, p-chloro-p'-diethylaminochalcone, p-ethyl-p'-diethylaminochalcone, m-ethyl-p'-diethylaminochalcone, p-methoxy-p'-diethylaminochalcone and m-ethoxy-p'-diethylaminochalcone, p-dimethylaminostyryl p-cyanostyryl ketone, p-dimethylaminostyryl p-chlorostyryl ketone, p-dimethylaminostyryl m-chlorostyryl ketone, p-dimethylaminostyryl p-bromostyryl ketone, p-dimethylaminostyryl m-bromostyryl ketone, p-dimethylaminostyryl ketone, p-dimethylaminostyryl m-methylstyryl ketone, p-dimethylaminostyryl p-methylstyryl ketone, p-dimethylaminostyryl p-ethylstyryl ketone, p-dimethylaminostyryl m-ethylstyryl ketone, p-dimethylaminostyryl p-methoxy styryl ketone, p-dimethylaminostyryl m-methoxystyryl ketone, p-dimethylaminostyryl p-ethoxystyryl ketone, bis(p-dimethylaminostyryl) ketone, p-diethylaminostyryl p-cyanostyryl ketone, p-diethylaminostyryl p-bromostyryl ketone, p-diethylaminostyryl m-chlorostyryl ketone, p-diethylaminostyryl styryl ketone, p-diethylaminostyryl p-methylstyryl ketone, p-diethylaminostyryl m-ethylstyryl ketone, p-diethylaminostyryl p-methoxystyryl ketone, p-diethylaminostyryl m-ethoxystyryl ketone and bis(p-diethylaminostyryl) ketone.

6. The photopolymerizable composition of claim 1, wherein said at least one p-dialkylamino aromatic carbonyl compound is selected from the group consisting of p-dimethylaminostyryl methyl ketone, p-dimethylaminostyryl ethyl ketone, p-dimethylaminostyryl propyl ketone, p-dimethylaminostyryl butyl ketone, p-dimethylaminostyryl isobutyl ketone, p-dimethylaminostyryl tert-butyl ketone, p-dimethylaminostyryl cyclohexyl ketone, p-dimethylaminostyryl benzyl ketone, p-dimethylaminostyryl phenethyl ketone, methyl p-dimethylamino cinnamate, ethyl p-dimethylaminocinnamate, p-dimethylaminostyryl 2-pyridyl ketone, p-dimethylaminostyryl 4-pyridyl ketone, p-dimethylaminostyryl 2-thienyl ketone, p-dimethylamino 9-anthryl ketone, 2-(p-dimethylaminobenzylidene)cyclohexanone, 2-(p-dimethylaminobenzylidene)cyclopentanone, p-dimethylaminochalcone, p-dimethylamino-m'-chlorochalcone, p-dimethylamino-p'-chlorochalcone, p-dimethylamino-m'-bromochalcone, p-dimethylamino-p'-bromochalcone, p-dimethylamino-p'-cyanochalcone, p-dimethylamino-p'-methoxychalcone, p-dimethylamino-p'-methylchalcone, p-dimethylamino-m'-methylchalcone, p-dimethylamino-p'-ethylchalcone, p-dimethylamino-m'-ethylchalcone, p-diethylamino-p'-bromochalcone, p-diethylamino-m'-bromochalcone, p'-diethylamino-p'-chlorochalcone, p-diethylamino-m'-chlorochalcone, p'-dimethylaminochalcone, p-cyano-p'-dimethylaminochalcone, m-chloro-p'-dimethylaminochalcone, p-chloro-p'-dimethylaminochalcone, m-bromo-p'-dimethylaminochalcone, p-bromo-p'-dimethylaminochalcone, m-methyl-p'-dimethylaminochalcone, p-methyl-p'-dimethylaminochalcone, p-methyl-p'-dimethylaminochalcone, m-ethyl-p'-dimethylaminochalcone, p-ethyl-p'-dimethylaminochalcone, p-methoxy-p'-dimethylaminochalcone, p,p'-bis(dimethylamino)chalcone, p-dimethylaminostyryl p-methylstyryl ketone, p-dimethylaminostyryl p-ethylstyryl ketone, p-dimethylaminostyryl p-chlorostyryl ketone, p-dimethylaminostyryl m-chlorostyryl ketone, p-dimethylaminostyryl p-bromostyryl ketone, p-dimethylaminostyryl m-bromostyryl ketone, p-dimethylaminostyryl p-methoxystyryl ketone, p-dimethylaminostyryl p-ethoxystyryl ketone, p-dimethylaminostyryl p-cyanostyryl ketone, p-dimethylaminostyryl m-methylstyryl ketone, p-dimethylaminostyryl m-ethylstyryl ketone, bis(p-dimethylaminostyryl) ketone and bis(p-diethylaminostyryl) ketone.

7. A composition as claimed in claim 1, wherein the addition-polymerizable compound (1) is selected from the group consisting of acrylic acid, methacrylic acid, itaconic acid, crotonic acid, isocrotonic acid and maleic acid.

8. A composition as claimed in claim 1, wherein the addition-polymerizable compound (1) is an ester of an aliphatic polyhydric alcohol.

9. A composition as claimed in claim 1, wherein the addition-polymerizable compound (1) is selected from the group consisting of trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol dimethacrylate, 1,3-butanediol diacrylate, 1,3-butanediol dimethacrylate, 1,4-butanediol diitaconate, sorbitol triacrylate, sorbitol tetraacrylate, sorbitol tetramethacrylate, sorbitol pentaacrylate, sorbitol hexaacrylate, 1,4-butylene modified diacrylate, trimethylolpropane modified triacrylate, pentaerythritol modified triacrylate and mixtures thereof.

10. A composition as claimed in claim 1, wherein the addition-polymerizable compound (1) is an oligoester acrylate or oligoester methacrylate.

11. A composition as claimed in claim 10, wherein said oligester is of the general formula

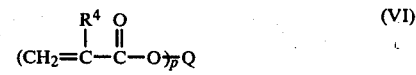

wherein $R^4$ represents a member selected from the group consisting of a hydrogen atom and a methyl group, Q represents an ester group containing at least one ester bond which comprises one or more polyhydric alcohols and one or more polybasic acids, and p represents an integer of 1 to 6.

12. A composition as claimed in claim 11, wherein said oligoester is selected from the group consisting of:

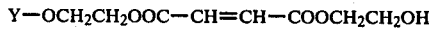

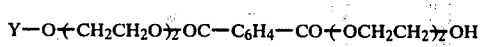

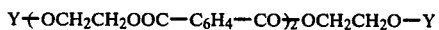

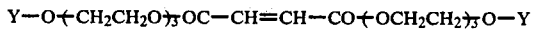

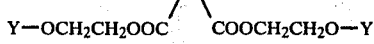

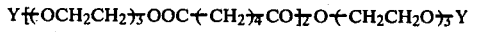

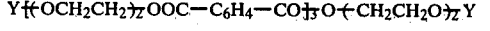

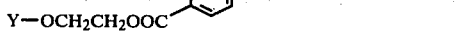

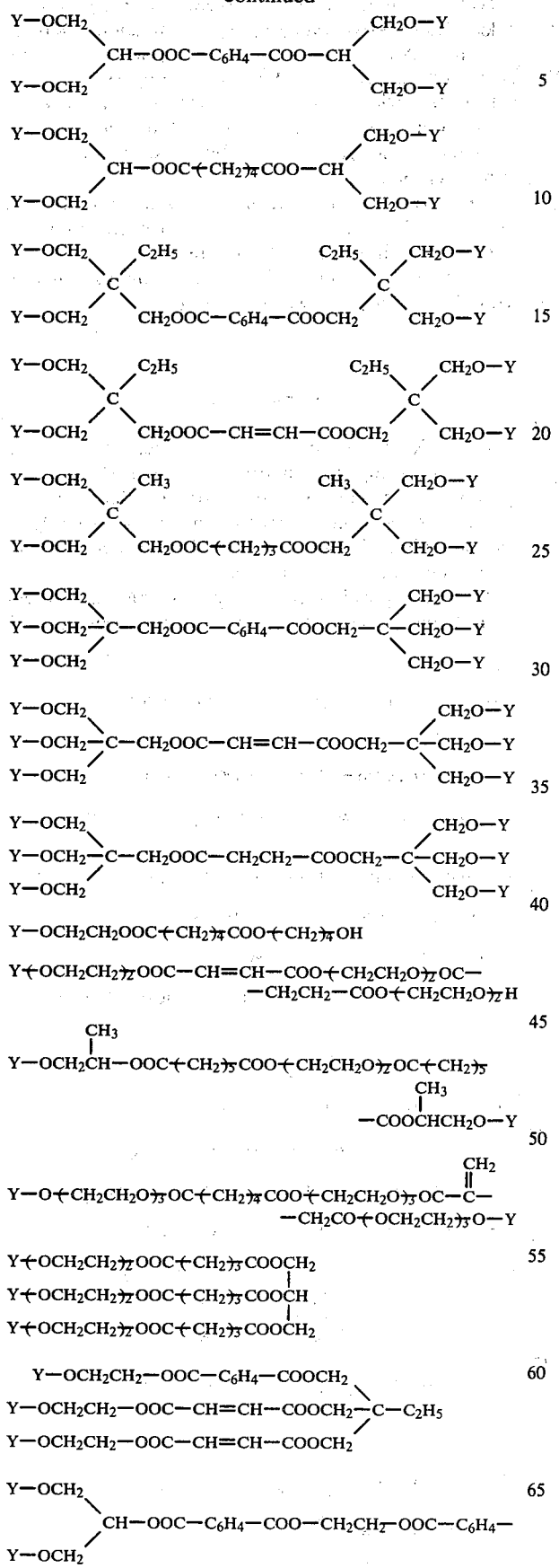

-continued

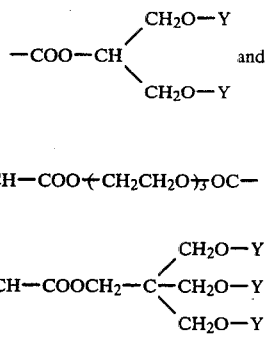

13. A composition as claimed in claim 1, wherein the ratio by weight of the initiator to the addition-polymerizable compound is about 1:5 to about 1:1000.

14. A composition as claimed in claim 13, wherein said ratio is about 1:10 to about 1:100.

15. A composition as claimed in claim 1, wherein the ratio by weight of components (a) and (b) of the initiator is about 30:1 to about 1:30.

16. A composition as claimed in claim 15, wherein said ratio is about 10:1 to about 1:10.

17. A composition as claimed in claim 1, which also includes a film-forming organic polymer of high molecular weight as a binder.

18. The photopolymerizable composition of claim 1, wherein said photopolymerization initiator consists essentially of a combination of elements (a) and (b).

19. The photopolymerizable composition of claim 1, wherein said photopolymerization initiator comprises a combination of

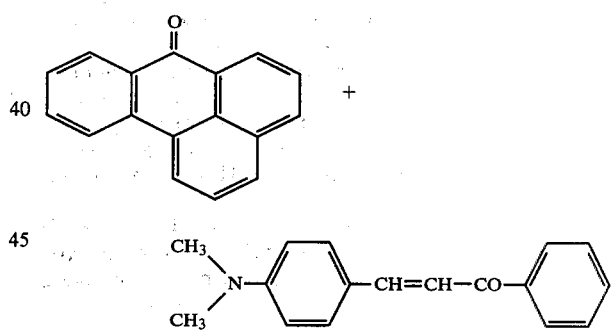

20. The photopolymerizable composition of claim 1, wherein said photopolymerization initiator comprises a combination of

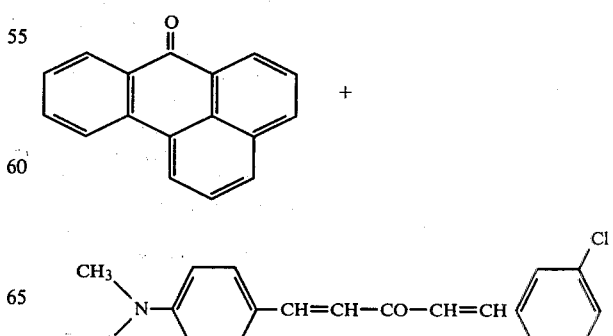

21. The photopolymerizable composition of claim 1, wherein said at aleast one p-dialkylamino aromatic carbonyl compound has general formula (I).

22. The photopolymerizable composition of claim 1, wherein said at least one p-dialkylamino aromatic carbonyl compound has general formula (II).

23. The photopolymerizable composition of claim 1, wherein said at least one p-dialkylamino aromatic carbonyl compound has general formula (III).

24. The photopolymerizable composition of claim 1, wherein said at least one p-dialkylamino aromatic carbonyl compound has general formula (V).

* * * * *